United States Patent
Chistyakov

(10) Patent No.: US 7,604,716 B2
(45) Date of Patent: *Oct. 20, 2009

(54) METHODS AND APPARATUS FOR GENERATING HIGH-DENSITY PLASMA

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 748 days.

This patent is subject to a terminal disclaimer.

(21) Appl. No.: 10/897,257

(22) Filed: Jul. 22, 2004

(65) Prior Publication Data

US 2005/0006220 A1    Jan. 13, 2005

(51) Int. Cl.
C23C 14/35 (2006.01)
C23C 16/00 (2006.01)

(52) U.S. Cl. .............. 204/192.12; 204/298.08; 204/298.06; 204/298.19; 315/111.21; 315/111.41; 118/723 R; 118/723 E

(58) Field of Classification Search ........... 204/192.12, 204/298.08, 298.06, 298.19; 118/723 R, 118/723 E; 315/111.21, 111.41
See application file for complete search history.

(56) References Cited

U.S. PATENT DOCUMENTS

| | | | |
|---|---|---|---|
| 4,588,490 A | 5/1986 | Cuomo et al. ........... 204/298 |
| 4,953,174 A | 8/1990 | Eldridge et al. ........... 372/87 |
| 5,015,493 A | 5/1991 | Gruen ................... 427/38 |
| 5,041,760 A * | 8/1991 | Koloc .................. 315/111.41 |
| 5,083,061 A | 1/1992 | Koshiishi et al. ....... 315/111.81 |
| 5,247,531 A | 9/1993 | Muller-Horshe ........... 372/38 |
| 5,286,360 A | 2/1994 | Szcyrbowski et al. ... 204/298.08 |
| 5,433,258 A | 7/1995 | Barnes et al. |
| 5,696,428 A | 12/1997 | Pasch |
| 5,718,813 A | 2/1998 | Drummond et al. ... 204/192.12 |
| 5,728,278 A | 3/1998 | Okamura et al. ....... 204/298.11 |
| 5,733,418 A | 3/1998 | Hershcovitch et al. . 204/192.11 |
| 5,795,452 A | 8/1998 | Kinoshita et al. ...... 204/298.37 |
| 5,916,455 A | 6/1999 | Kumagai |
| 5,993,761 A * | 11/1999 | Czernichowski et al. .... 423/210 |

(Continued)

FOREIGN PATENT DOCUMENTS

EP    0 650 183 A1    4/1995

(Continued)

OTHER PUBLICATIONS

Booth, et al., The Transition From Symmetric To Asymmetric Discharges In Pulsed 13.56 MHz Capacitively Coupled Plasmas, J. Appl. Phys., Jul. 15, 1997, pp. 552-560, vol. 82, No. 2, American Institute of Physics.

(Continued)

*Primary Examiner*—Rodney G McDonald
(74) *Attorney, Agent, or Firm*—Kurt Rauschenbach; Rauschenbach Patent Law Group, LLC

(57) ABSTRACT

Methods and apparatus for generating a strongly-ionized plasma are described. An apparatus for generating a strongly-ionized plasma according to the present invention includes an anode and a cathode that is positioned adjacent to the anode to form a gap there between. An ionization source generates a weakly-ionized plasma proximate to the cathode. A power supply produces an electric field in the gap between the anode and the cathode. The electric field generates excited atoms in the weakly-ionized plasma and generates secondary electrons from the cathode. The secondary electrons ionize the excited atoms, thereby creating the strongly-ionized plasma.

33 Claims, 13 Drawing Sheets

U.S. PATENT DOCUMENTS

| | | | |
|---|---|---|---|
| 6,057,244 A | 5/2000 | Hausmann et al. | 438/706 |
| 6,238,537 B1 | 5/2001 | Kahn et al. | 204/598.04 |
| 6,296,742 B1 | 10/2001 | Kouznetsov | 204/192.12 |
| 6,361,667 B1 | 3/2002 | Kobayashi et al. | 204/298.11 |
| 6,413,382 B1 | 7/2002 | Wang et al. | 204/192.12 |
| 6,413,383 B1 | 7/2002 | Chiang et al. | 204/192.13 |
| 6,432,260 B1 | 8/2002 | Mahoney et al. | |
| 6,436,251 B2 | 8/2002 | Gopalraja et al. | 204/298.12 |
| 6,451,703 B1 | 9/2002 | Liu et al. | 438/710 |
| 6,471,833 B2 | 10/2002 | Kumar et al. | 204/192.37 |
| 6,488,825 B1* | 12/2002 | Hilliard | 204/298.06 |
| 2002/0019139 A1 | 2/2002 | Zhang et al. | 438/714 |
| 2002/0114897 A1 | 8/2002 | Sumiya et al. | 427/569 |
| 2003/0006008 A1 | 1/2003 | Horioka et al. | 156/345.46 |

FOREIGN PATENT DOCUMENTS

| | | |
|---|---|---|
| WO | WO 98/40532 | 9/1998 |
| WO | WO 01/98553 | 12/2001 |
| WO | WO 01/98553 A1 | 12/2001 |

OTHER PUBLICATIONS

Bunshah, et al., Deposition Technologies For Films And Coatings, pp. 178-183, Noyes Publications, Park Ridge, New Jersey.

Daugherty, et al., Attachment-Dominated Electron-Beam-Ionized Discharges, Applied Physics Letters, May 15, 1976, pp. 581-583, vol. 28, No. 10, American Institute of Physics.

Goto, et al., Dual Excitation Reactive Ion Etcher For Low Energy Plasma Processing, J. Vac. Sci. Technol. A., Sep./Oct. 1992, pp. 3048-3054, vol. 10, No. 5, American Vacuum Society.

Kouznetsov, et al., A Novel Pulsed Magnetron Sputter Technique Utilizing Very High Target Power Densities, Surface and Coatings Technology, 1999, pp. 290-293, vol. 122, Elsevier Science S.A.

Lindquist, et al., High Selectivity Plasma Etching Of Silicone Dioxide With A Dual Frequency 27/2 MHz Capacitive RF Discharge.

Macak, Reactive Sputter Deposition Process of Al2O3 And Characterization Of A Novel High Plasma Density Pulsed Magnetron Discharge, Linkoping Studies In Science And Technology, pp. 1-2.

Macak, et al., Ionized Sputter Deposition Using An Extremely High Plasma Density Pulsed Magnetron Discharge, J. Vac. Sci. Technol. A., Jul./Aug. 2000, pp. 1533-1537, vol. 18, No. 4., American Vacuum Society.

Mozgrin, et al., High-Current Low-Pressure Quasi-Stationary Discharge In A Magnetic Field: Experimental Research, Plasma Physics Reports, 1995, pp. 400-409, vol. 21, No. 5.

Rossnagel, et al., Induced Drift Currents In Circular Planar Magnetrons, J. Vac. Sci. Technol. A., Jan./Feb. 1987, pp. 88-91, vol. 5, No. 1, American Vacuum Society.

Sheridan, et al., Electron Velocity Distribution Functions In A Sputtering Magnetron Discharge For The EXB Direction, J. Vac. Sci. Technol. A., Jul./Aug. 1998, pp. 2173-2176, vol. 16, No. 4, American Vacuum Society.

Steinbruchel, A Simple Formula For Low-Energy Sputtering Yields, Applied Physics A., 1985, pp. 37-42, vol. 36, Springer-Verlag.

Encyclopedia Of Low Temperature Plasma p. 119, vol. 3.

Encyclopedia Of Low Temperature Plasma p. 123, vol. 3.

Chistyakov, Roman, High Power Pulsed Magnetron Sputtering, U.S. Appl. No. 10/065,277, filed Sep. 30, 2002.

Chistyakov, Roman, High Power Pulsed Magnetically Enhanced Plasma Processing, U.S. Appl. No. 10/065,551, filed Oct. 29, 2002.

Booth, et al., The Transition From Symmetric To Asymmetric Discharges In Pulsed 13.56 MHz Capacity Coupled Plasmas, J. Appl. Phys., Jul. 15, 1997, pp. 552-560, vol. 82 (2), American Institute of Physics.

Bunshah, et al., Deposition Technologies For Films And Coatings, Materials Science Series, pp. 176-183, Noyes Publications, Park Ridge, New Jersey.

Daugherty, et al., Attachment-Dominated Electron-Beam-Ionized Discharges, Applied Science Letters, May 15, 1976, vol. 28, No. 10, American Institute of Physics.

Goto, et al., Dual Excitation Reactive Ion Etcher for Low Energy Plasma Processing, J. Vac. Sci. Technol. A, Sep./Oct. 1992, pp. 3048-3054, vol. 10, No. 5, American Vacuum Society.

Kouznetsov, et al., A Novel Pulsed Magnetron Sputter Technique Utilizing Very High Target Power Densities, Surface & Coatings Technology, pp. 290-293, Elsevier Sciences S.A.

Lindquist, et al., High Selectivity Plasma Etching Of Silicon Dioxide With A Dual Frequency 27/2 MHz Capacitive RF Discharge.

Macak, Reactive Sputter Deposition Process of Al2O3 and Characterization Of A Novel High Plasma Density Pulsed Magnetron Discharge, Linkoping Studies In Science And Technology, 1999, pp. 1-2, Sweden.

Macak, et al., Ionized Sputter Deposition Using An Extremely High Plasma Density Pulsed Magnetron Discharge, J. Vac. Sci. Technol. A., Jul./Aug. 2000, pp. 1533-1537, vol. 18, No. 4, American Vacuum Society.

Mozgrin, et al., High-Current Low-Pressure Quasi-Stationary Discharge In A Magnetic Field: Experimental Research, Plasma Physics Reports, 1995, pp. 400-409, vol. 21, No. 5, Mozgrin, Feitsov, Khodachenko.

Chistyakov, Roman, High-Power Pulsed Magnetron Sputtering, U.S. Appl. No. 10/065,277, filed Sep. 30, 2002.

Chistyakov, Roman, High-Power Pulsed Magnetically Enhanced Plasma Processing, U.S. Appl. No. 10/065,551, filed Oct. 30, 2002.

Chistyakov, High-Power Pulsed Magnetron Sputtering, U.S. Appl. No. 10/065,277, filed Sep. 30, 2002.

Chistyakov, High-Power Pulsed Magnetically Enhanced Plasma Processing, U.S. Appl. No. 10/065,551, filed Oct. 29, 2002.

Chistyakov, Roman, Method And Apparatus For Generating High-Density Plasma, U.S. Appl. No. 10/065,629, filed Nov. 4, 2002.

Chistyakov, Roman, High Deposition Rate Sputtering, U.S. Appl. No. 10/065,739, filed Nov. 14, 2002.

Chistyakov, Roman, Plasma Generation Using Multi-Step Ionization, U.S. Appl. No. 10/249,202, filed Mar. 21, 2003.

Chistyakov, Roman, High-Density Plasma Source, U.S. Appl. No. 10/249,595, filed Apr. 22, 2003.

Chistyakov, Roman, Generation Of Uniformly Distributed Plasma, U.S. Appl. No. 10/249,773, filed May 6, 2003.

Chistyakov, Roman, High-Density Plasma Source Using Excited Atoms, U.S. Appl. No. 10/249,844, filed May 12, 2003.

Chistyakov, Roman, Plasma Source With Segmented Cathode, U.S. Appl. No. 60/481,671, filed Nov. 19, 2003.

Chistyakov, Roman, Methods And Apparatus For Generating Strongly-Ionized Plasmas With Ionizational Instabilities, U.S. Appl. No. 10/708,281, filed Feb. 22, 2004.

Chistyakov, Roman, Plasma Source With Segmented Cathode, U.S. Appl. No. 10/710,946, filed Aug. 13, 2004.

"Notification Of Transmittal Of The International Search Report Or The Declaration" For PCT/US03/34483, Apr. 8, 2004, 5 pages, The International Searching Authority/EPO, Rijswijk, The Netherlands.

US 5,863,392, 01/1999, Drummond et al. (withdrawn)

\* cited by examiner

METHODS AND APPARATUS FOR GENERATING HIGH-DENSITY PLASMA

BACKGROUND OF INVENTION

Plasma is considered the fourth state of matter. A plasma is a collection of charged particles moving in random directions. A plasma is, on average, electrically neutral. One method of generating a plasma is to drive a current through a low-pressure gas between two parallel conducting electrodes. Once certain parameters are met, the gas "breaks down" to form the plasma. For example, a plasma can be generated by applying a potential of several kilovolts between two parallel conducting electrodes in an inert gas atmosphere (e.g., argon) at a pressure that is between about $10^{-1}$ and $10^{-2}$ Torr.

Plasma processes are widely used in many industries, such as the semiconductor manufacturing industry. For example, plasma etching is commonly used to etch substrate material and films deposited on substrates in the electronics industry. There are four basic types of plasma etching processes that are used to remove material from surfaces: sputter etching, pure chemical etching, ion energy driven etching, and ion inhibitor etching.

Plasma sputtering is a technique that is widely used for depositing films on substrates. Sputtering is the physical ejection of atoms from a target surface and is sometimes referred to as physical vapor deposition (PVD). Ions, such as argon ions, are generated and then are drawn out of the plasma, and are accelerated across a cathode dark space. The target has a lower potential than the region in which the plasma is formed. Therefore, the target attracts positive ions. Positive ions move towards the target with a high velocity. Positive ions impact the target and cause atoms to physically dislodge or sputter from the target. The sputtered atoms then propagate to a substrate where they deposit a film of sputtered target material. The plasma is replenished by electron-ion pairs formed by the collision of neutral molecules with secondary electrons generated at the target surface.

Magnetron sputtering systems use magnetic fields that are shaped to trap and to concentrate secondary electrons, which are produced by ion bombardment of the target surface. The plasma discharge generated by a magnetron sputtering system is located proximate to the surface of the target and has a high density of electrons. The high density of electrons causes ionization of the sputtering gas in a region that is close to the target surface.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
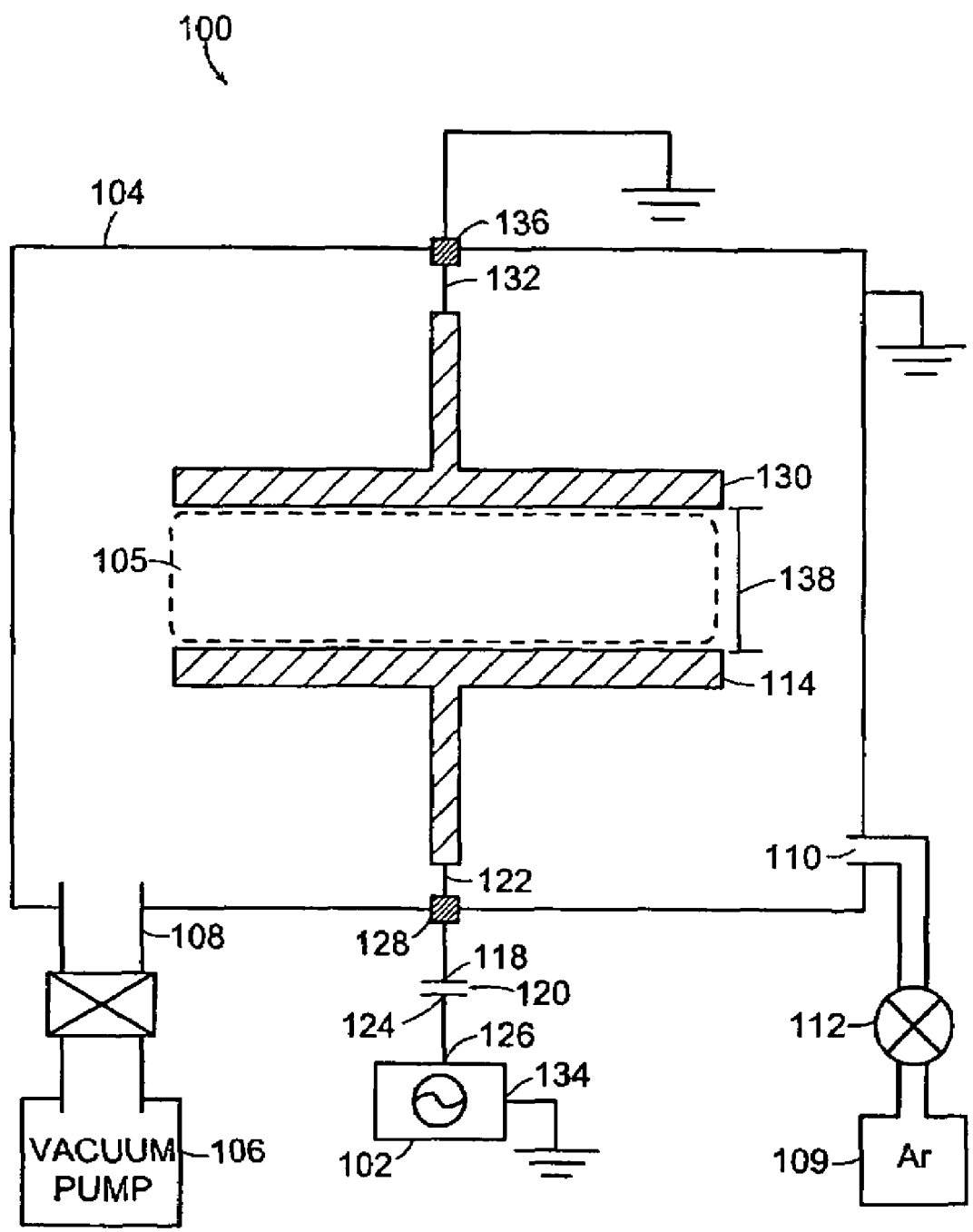
FIG. 1 illustrates a cross-sectional view of a known plasma generating apparatus having a radio-frequency (RF) power supply.

FIG. 1 illustrates a cross-sectional view of a known plasma generating apparatus 100 having a radio-frequency (RF) power supply 102. The known plasma generating apparatus 100 includes a vacuum chamber 104 where the plasma 105 is generated. The vacuum chamber 104 is positioned in fluid communication with a vacuum pump 106 via a conduit 108. The vacuum pump 106 is adapted to evacuate the vacuum chamber 104 to high vacuum. The pressure inside the vacuum chamber 104 is generally less than $10^{-1}$ Torr. A feed gas from a feed gas source 109, such as an argon gas source, is introduced into the vacuum chamber 104 through a gas inlet 110. The gas flow is controlled by a valve 112.

The plasma generating apparatus 100 also includes a cathode 114. The cathode 114 is generally in the shape of a circular disk. The cathode 114 is electrically connected to a first terminal 118 of a blocking capacitor 120 with an electrical transmission line 122. A second terminal 124 of the blocking capacitor 120 is coupled to a first output 126 of the RF power supply 102. An insulator 128 can be used to pass the electrical transmission line 122 through a wall of the vacuum chamber 104 in order to electrically isolate the cathode 114 from the vacuum chamber 104.

An anode 130 is positioned in the vacuum chamber 104 proximate to the cathode 114. The anode 130 is typically coupled to ground using an electrical transmission line 132. A second output 134 of the RF power supply 102 is also typically coupled to ground. In order to isolate the anode 130 from the vacuum chamber 104, an insulator 136 can be used to pass the electrical transmission line 132 through a wall of the vacuum chamber 104. The vacuum chamber 104 can also be coupled to ground.

In operation, the RF power supply 102 applies a RF voltage pulse between the cathode 114 and the anode 130 that has a sufficient amplitude to ionize the argon feed gas in the vacuum chamber 104. A typical RF driving voltage is between 100V and 1000V, and the distance 138 between the cathode 114 and the anode is between about 2 cm and 10 cm. Typical pressures are in the range of 10 mTorr to 100 mTorr. Typical power densities are in the range of 0.1 W/cm² to 1 W/cm². The driving frequency is typically 13.56 MHz. Typical plasma densities are in the range of $10^9$ cm$^{-3}$ to $10^{11}$ cm$^{-3}$, and the electron temperature is on the order of 3 eV.

This typical ionization process is referred to as direct ionization or atomic ionization by electron impact and can be described as follows:

$$Ar + e^- \rightarrow Ar^+ + 2e^-$$

where Ar represents a neutral argon atom in the feed gas and e⁻ represents an ionizing electron generated in response to the voltage applied between the cathode 114 and the anode 130. The collision between the neutral argon atom and the ionizing electron results in an argon ion (Ar$^+$) and two electrons.

The plasma discharge is maintained, at least in part, by secondary electron emission from the cathode. However, typical operating pressures must be relatively high so that the secondary electrons are not lost to the anode 130 or the walls of the chamber 104. These pressures are not optimal for most plasma processes.

It is desirable to operate a plasma discharge at higher current densities, lower voltages, and lower pressures than can be obtained in a conventional glow discharge. This has led to the use of a DC magnetic field near the cathode 114 to confine the secondary electrons. Confining the secondary electrons substantially confines the plasma at a location (not shown) in the chamber 104 thereby increasing the plasma density at that location for a given input power, while reducing the overall loss area.

The magnetic confinement primarily occurs in a confinement region (not shown) where there is a relatively low magnetic field intensity. The shape and location of the confinement region depends on the design of the magnets. Generally, a higher concentration of positively charged ions in the plasma is present in the confinement region than elsewhere in the chamber 104. Consequently, the uniformity of the plasma can be severely diminished in magnetically enhanced systems.

The non-uniformity of the plasma in magnetron sputtering systems can result in undesirable non-uniform erosion of target material and thus relatively poor target utilization. The non-uniformity of the plasma in magnetron etching systems can result in non-uniform etching of a substrate.

Dramatically increasing the RF power applied to the plasma alone will not result in the formation of a more uniform and denser plasma. Furthermore, the amount of applied power necessary to achieve even an incremental increase in uniformity and density can increase the probability of generating an electrical breakdown condition leading to an undesirable electrical discharge (an electrical arc) in the chamber 104.

Pulsing direct current (DC) power applied to the plasma can be advantageous since the average discharge power can remain relatively low while relatively large power pulses are periodically applied. Additionally, the duration of these large voltage pulses can be preset so as to reduce the probability of establishing an electrical breakdown condition leading to an undesirable electrical discharge. An undesirable electrical discharge will corrupt the plasma process and can cause contamination in the vacuum chamber 104. However, very large power pulses can still result in undesirable electrical discharges regardless of their duration.

Figure 2A:
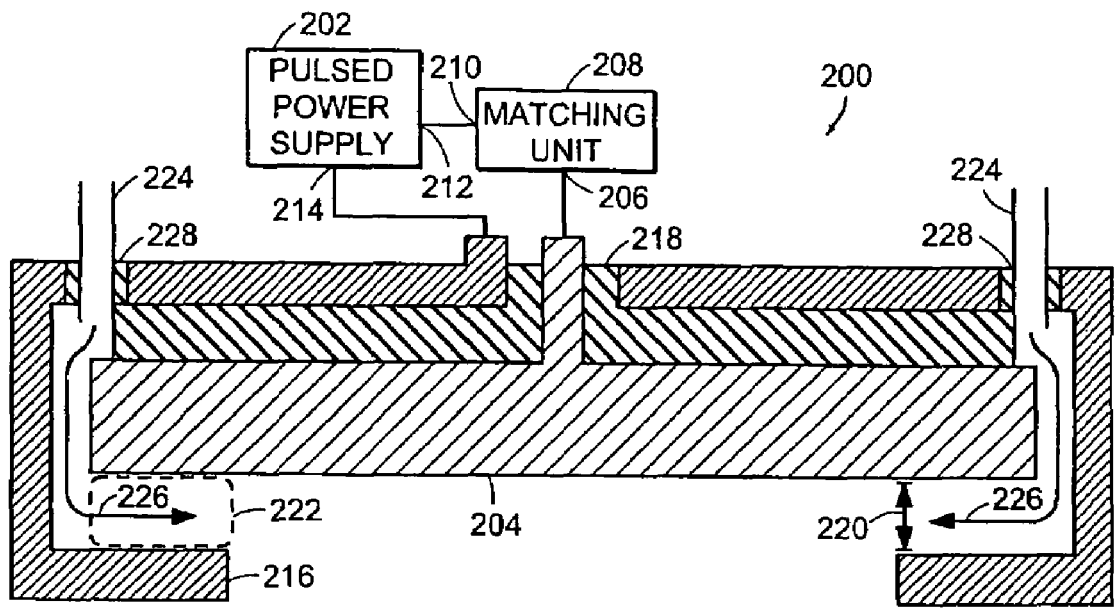
FIG. 2A through FIG. 2D illustrate cross-sectional views of a plasma generating apparatus having a pulsed power supply according to one embodiment of the invention.

FIG. 2A through FIG. 2D illustrate cross-sectional views of a plasma generating apparatus 200 having a pulsed power supply 202 according to one embodiment of the invention. For example, FIG. 2A illustrates a cross-sectional view of a plasma generating apparatus 200 having a pulsed power supply 202 at a time before the pulsed power supply 202 is activated. In one embodiment, the plasma generating apparatus 200 includes a chamber (not shown), such as a vacuum chamber that supports the plasma. The chamber can be coupled to a vacuum system (not shown).

The plasma generating apparatus 200 also includes a cathode 204. In one embodiment, the cathode 204 can be composed of a metal material such as stainless steel or any other material that does not chemically react with reactive gases. In another embodiment, the cathode 204 includes a target that can be used for sputtering. The cathode 204 is coupled to an output 206 of a matching unit 208. An input 210 of the matching unit 208 is coupled to a first output 212 of the pulsed power supply 202. A second output 214 of the pulsed power supply 202 is coupled to an anode 216. An insulator 218 isolates the anode 216 from the cathode 204.

In one embodiment, the first output 212 of the pulsed power supply 202 is directly coupled to the cathode 204 (not shown). In one embodiment (not shown), the second output 214 of the pulsed power supply 202 is coupled to ground. In this embodiment, the anode 216 is also coupled to ground.

In one embodiment (not shown), the first output 212 of the pulsed power supply 202 couples a negative voltage impulse to the cathode 204. In another embodiment (not shown), the second output 214 of the pulsed power supply 202 couples a positive voltage impulse to the anode 216.

In one embodiment, the pulsed power supply 202 generates peak voltage levels of up to about 30,000V. Typical operating voltages are generally between about 50V and 30 kV. In one embodiment, the pulsed power supply 202 generates peak current levels of less than 1 A to about 5,000 A or more depending on the volume of the plasma. Typical operating currents varying from less than one hundred amperes to more than a few thousand amperes depending on the volume of the plasma. In one embodiment, the pulses generated by the pulsed power supply 202 have a repetition rate that is below 1 kHz. In one embodiment, the pulse width of the pulses generated by the pulsed power supply 202 is substantially between about one microsecond and several seconds.

The anode 216 is positioned so as to form a gap 220 between the anode 216 and the cathode 204 that is sufficient to allow current to flow through a region 222 between the anode 216 and the cathode 204. In one embodiment, the width of the gap 220 is between approximately 0.3 cm and 10 cm. The surface area of the cathode 204 determines the volume of the region 222. The gap 220 and the total volume of the region 222 are parameters in the ionization process as described herein.

In one embodiment, the plasma generating apparatus 200 includes a chamber (not shown), such as a vacuum chamber. The chamber is coupled in fluid communication to a vacuum pump (not shown) through a vacuum valve (not shown). In one embodiment, the chamber (not shown) is electrically coupled to ground potential. One or more gas lines 224 provide feed gas 226 from a feed gas source (not shown) to the chamber. In one embodiment, the gas lines 224 are isolated from the chamber and other components by insulators 228. In other embodiments, the gas lines 224 can be isolated from the feed gas source using in-line insulating couplers (not shown). The gas source can be any feed gas 226 including but not limited to argon. In some embodiments, the feed gas 226 can include a mixture of different gases, reactive gases, or pure reactive gas gases. In some embodiments, the feed gas 226 includes a noble gas or a mixture of gases.

In operation, the feed gas 226 from the gas source is supplied to the chamber by a gas flow control system (not shown). Preferably, the feed gas 226 is supplied between the cathode 204 and the anode 216. Directly injecting the feed gas 226 between the cathode 204 and the anode 216 can increase the flow rate of the feed gas 226. This causes a rapid volume exchange in the region 222 between the cathode 204 and the anode 216, which permits a high-power pulse having a longer duration to be applied across the gap 220. The longer duration high-power pulse results in the formation of a higher density plasma. This volume exchange is described herein in more detail.

Figure 2B:
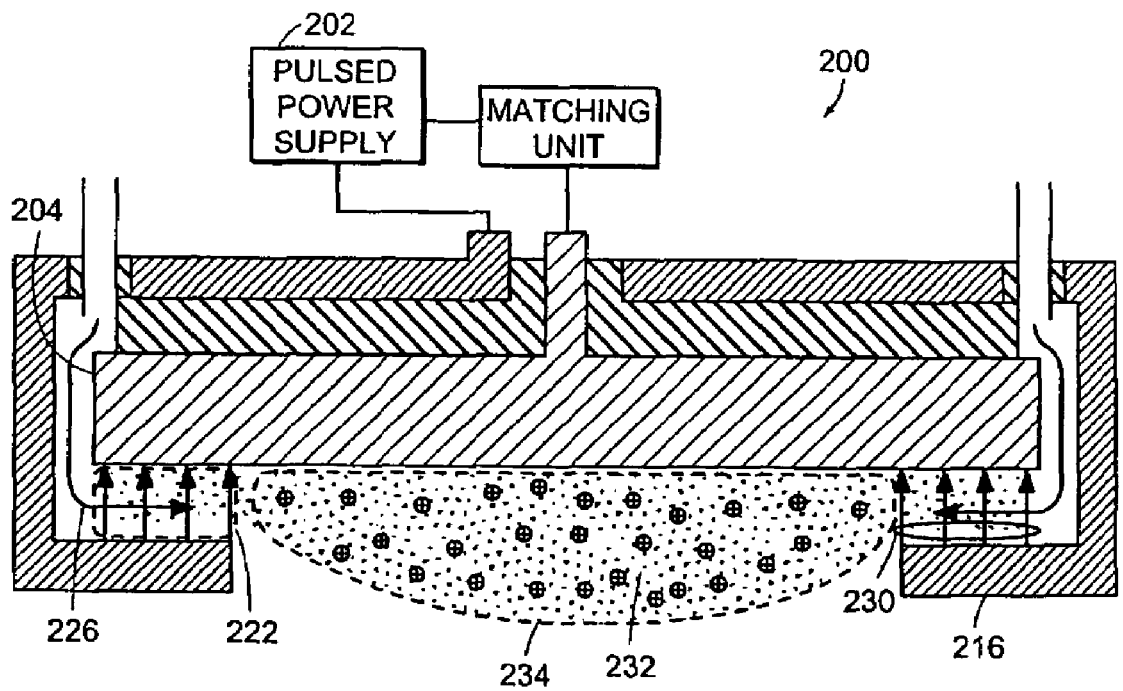

In one embodiment, the pulsed power supply 202 is a component in an ionization source that generates a weakly-ionized plasma 232. Referring to FIG. 2B, after the feed gas is supplied between the cathode 204 and the anode 216, the pulsed power supply 202 applies a voltage pulse between the cathode 204 and the anode 216. In one embodiment, the pulsed power supply 202 applies a negative voltage pulse to the cathode 204. The size and shape of the voltage pulse are chosen such that an electric field 230 develops between the cathode 204 and the anode 216. The amplitude and shape of the electric field 230 are chosen such that a weakly-ionized plasma 232 is generated in the region 222 between the anode 216 and the cathode 204.

The weakly-ionized plasma 232 is also referred to as a pre-ionized plasma. In one embodiment, the peak plasma density of the pre-ionized plasma is between about $10^6$ and $10^{12}$ cm$^{-3}$ for argon feed gas. The pressure in the chamber can vary from about $10^{-3}$ to 10 Torr or higher. The pressure can vary depending on various system parameters, such as the presence of a magnetic field proximate to the cathode 204. The peak plasma density of the weakly-ionized plasma 232 depends on the properties of the specific plasma generating system and is a function of the location of the measurement in the weakly-ionized plasma 232.

In one embodiment, to generate the weakly-ionized plasma 232, the pulsed power supply 202 generates a low power pulse having an initial voltage of between about 100V and 5 kV with a discharge current of between about 0.1 A and 100 A. In some embodiments, the width of the pulse can be in on the order of 0.1 microseconds up to one hundred seconds. Specific parameters of the pulse are discussed herein in more detail.

In one embodiment, prior to the generation of the weakly-ionized plasma 232, the pulsed power supply 202 generates a potential difference between the cathode 204 and the anode 216 before the feed gas 226 is supplied between the cathode 204 and the anode 216. In another embodiment, the pulsed power supply 202 generates a current through the gap 220 after the feed gas 226 is supplied between the cathode 204 and the anode 216.

In another embodiment, a direct current (DC) power supply (not shown) is used in an ionization source to generate and maintain the weakly-ionized or pre-ionized plasma 232. In this embodiment, the DC power supply is adapted to generate a voltage that is large enough to ignite the weakly-ionized plasma 232. In one embodiment, the DC power supply generates an initial voltage of several kilovolts that creates a plasma discharge voltage on the order of between about 100V and 1 kV with a discharge current in the range of about 0.1 A and 100 A between the cathode 204 and the anode 216 in order to generate and maintain the weakly-ionized plasma 232. The value of the discharge current depends on the power level of the power supply and is a function of the volume of the weakly-ionized plasma 232. Furthermore, the presence of a magnetic field (not shown) in the region 222 can have a dramatic effect on the value of the applied voltage and current required to generate the weakly-ionized plasma 232.

In some embodiments (not shown), the DC power supply generates a current that is between about 1 mA and 100 A depending on the size of the plasma generating system and the strength of a magnetic field in a region 234. In one embodiment, before generating the weakly-ionized plasma 232, the DC power supply is adapted to generate and maintain an initial peak voltage between the cathode 204 and the anode 216 before the introduction of the feed gas 226.

In another embodiment, an alternating current (AC) power supply (not shown) is used to generate and maintain the weakly-ionized or pre-ionized plasma 232. For example, the weakly-ionized or pre-ionized plasma 232 can be generated and maintained using electron cyclotron resonance (ECR), capacitively coupled plasma discharge (CCP), or inductively coupled plasma (ICP) discharge.

AC power supplies can require less power to generate and maintain a weakly-ionized plasma than a DC power supply. In addition, the pre-ionized or weakly-ionized plasma 232 can be generated by numerous other techniques, such as UV radiation techniques, X-ray techniques, electron beam techniques, ion beam techniques, or ionizing filament techniques. These techniques include components used in ionization sources according to the invention. In some embodiments, the weakly-ionized plasma is formed outside of the region 222 and then diffuses into the region 222.

Forming the weakly-ionized or pre-ionized plasma 232 substantially eliminates the probability of establishing a breakdown condition in the chamber when high-power pulses are applied between the cathode 204 and the anode 216. The probability of establishing a breakdown condition is substantially eliminated because the weakly-ionized plasma 232 has a low-level of ionization that provides electrical conductivity through the plasma. This conductivity substantially prevents the setup of a breakdown condition, even when high power is applied to the plasma.

In one embodiment, as the feed gas 226 is pushed through the region 222, the weakly-ionized plasma 232 diffuses somewhat homogeneously through the region 234. This homogeneous diffusion tends to facilitate the creation of a highly uniform strongly-ionized plasma in the region 234.

In one embodiment (not shown), the weakly-ionized plasma 232 can be trapped proximate to the cathode 204 by a magnetic field. Specifically, electrons in the weakly-ionized plasma 232 can be trapped by a magnetic field generated proximate to the cathode 204. In one embodiment, the strength of the magnetic field is between about fifty and two thousand gauss.

In one embodiment, a magnet assembly (not shown) generates the magnet field located proximate to the cathode 204. The magnet assembly can include permanent magnets (not shown), or alternatively, electro-magnets (not shown). The configuration of the magnet assembly can be varied depending on the desired shape and strength of the magnetic field. In alternate embodiments, the magnet assembly can have either a balanced or unbalanced configuration. In one embodiment, the magnet assembly includes switching electro-magnets, which generate a pulsed magnetic field proximate to the cathode 204. In some embodiments, additional magnet assemblies (not shown) can be placed at various locations around and throughout the chamber (not shown).

Figure 2C:
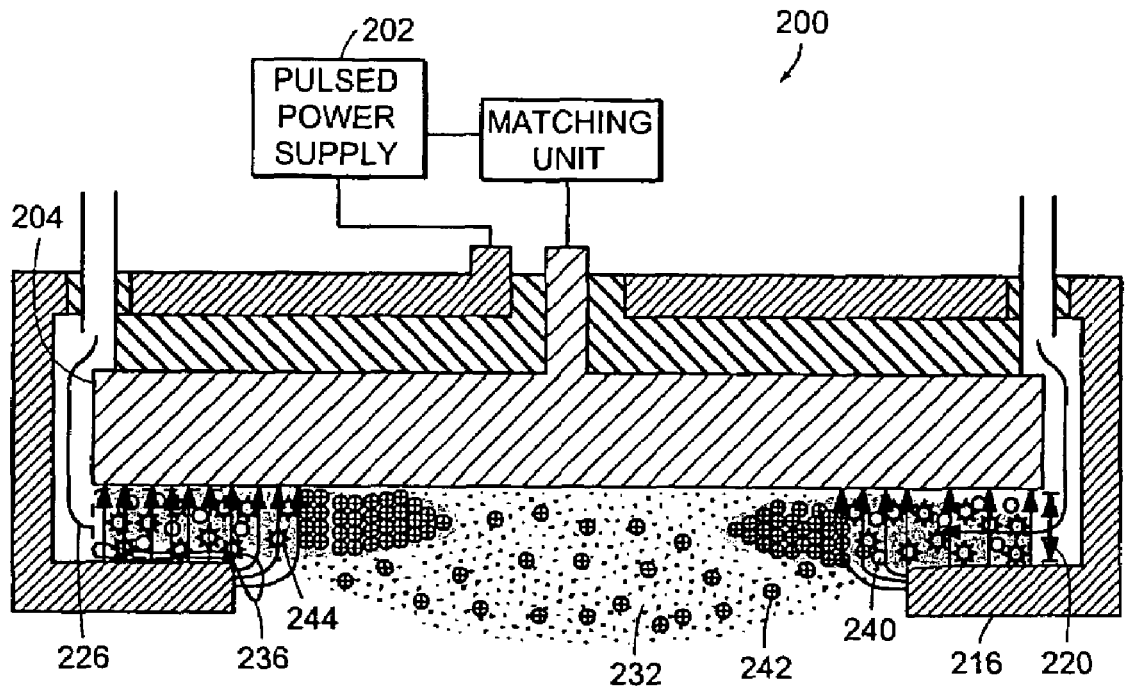

Referring to FIG. 2C, once the weakly-ionized plasma 232 is formed, the pulsed power supply 202 generates high-power pulses between the cathode 204 and the anode 216 (FIG. 2C). The desired power level of the high-power pulses depends on several factors including the density of the weakly-ionized plasma 232, and the volume of the plasma, for example. In one embodiment, the power level of the high-power pulse is in the range of about 1 kW to about 10 MW or higher.

Each of the high-power pulses is maintained for a predetermined time that, in some embodiments, is approximately one microsecond to ten seconds. The repetition frequency or repetition rate of the high-power pulses, in some embodiments, is in the range of between about 0.1 Hz to 1 kHz. The average power generated by the pulsed power supply 202 can be less than one megawatt depending on the volume of the plasma. In one embodiment, the thermal energy in the cathode 204 and/or the anode 216 is conducted away or dissipated by liquid or gas cooling such as helium cooling (not shown).

The high-power pulses generate a strong electric field 236 between the cathode 204 and the anode 216. The strong electric field 236 is substantially located in the region 222 between the cathode 204 and the anode 216. In one embodiment, the electric field 236 is a pulsed electric field. In another embodiment, the electric field 236 is a quasi-static electric field. By quasi-static electric field we mean an electric field that has a characteristic time of electric field variation that is much greater than the collision time for electrons with neutral gas particles. Such a time of electric field variation can be on the order of ten seconds. The strength and the position of the strong electric field 236 will be discussed in more detail herein.

Figure 2D:
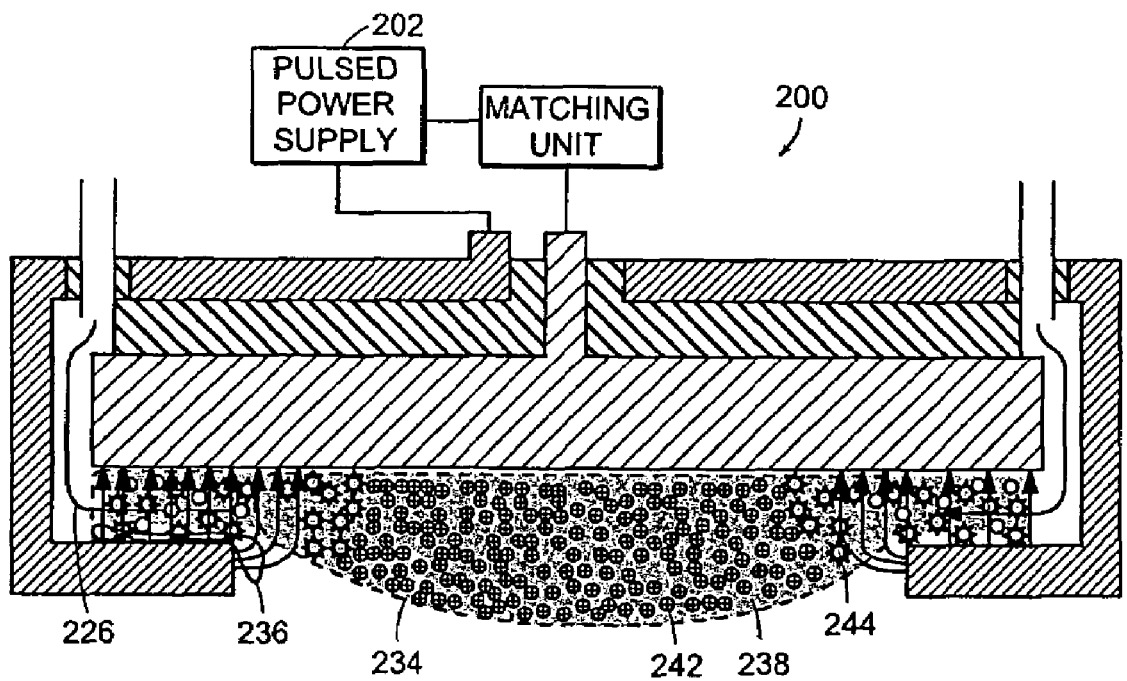

Referring to FIG. 2D, the high-power pulses generate a highly-ionized or a strongly-ionized plasma 238 from the weakly-ionized plasma 232 (FIG. 2C). The strongly-ionized plasma 238 is also referred to as a high-density plasma. The discharge current that is formed from the strongly-ionized plasma 238 can be on the order of about 5 kA or more with a discharge voltage in the range of between about 50V and 500V for a pressure that is on the order of between about 100 mTorr and 10 Torr.

In one embodiment, the strongly-ionized plasma 238 tends to diffuse homogenously in the region 234. The homogenous diffusion creates a more homogeneous plasma volume. Homogenous diffusion is described in more detail with reference to FIG. 5A through FIG. 5D.

Homogeneous diffusion is advantageous for many plasma processes. For example, plasma etching processes having homogenous diffusion accelerate ions in the strongly-ionized plasma 238 towards the surface of the substrate (not shown) being etched in a more uniform manner than with conventional plasma etching. Consequently, the surface of the substrate is etched more uniformly. Plasma processes having homogeneous diffusion can achieve high uniformity without the necessity of rotating the substrate.

Also, magnetron sputtering systems having homogenous diffusion accelerate ions in the strongly-ionized plasma 238 towards the surface of the sputtering target in a more uniform manner than with conventional magnetron sputtering. Consequently, the target material is deposited more uniformly on a substrate without the necessity of rotating the substrate and/or the magnetron. Also, the surface of the sputtering target is eroded more evenly and, thus higher target utilization is achieved.

In one embodiment, the plasma generating apparatus 200 of the present invention generates a relatively high electron temperature plasma and a relatively high-density plasma. One application for the strongly-ionized plasma 238 of the present invention is ionized physical vapor deposition (IPVD) (not shown), which is a technique that converts neutral sputtered atoms into positive ions to enhance a sputtering process.

Referring again to FIG. 2D, the strong electric field 236 facilitates a multi-step ionization process of the feed gas 226 that substantially increases the rate at which the strongly-ionized plasma 238 is formed. In one embodiment, the feed gas is a molecular gas and the strong electric field 236 enhances the formation of ions in the plasma. The multi-step or stepwise ionization process is described as follows.

A pre-ionizing voltage is applied between the cathode 204 and the anode 216 across the feed gas 226 to form the weakly-ionized plasma 232. The weakly-ionized plasma 232 is generally formed in the region 222 and diffuses to the region 234 as the feed gas 226 continues to flow. In one embodiment (not shown) a magnetic field is generated in the region 222 and extends to the center of the cathode 204. This magnetic field tends to assist in diffusing electrons from the region 222 to the region 234. The electrons in the weakly-ionized plasma 232 are substantially trapped in the region 234 by the magnetic field. In one embodiment, the volume of weakly-ionized plasma in the region 222 is rapidly exchanged with a new volume of feed gas 226.

After the formation of the weakly-ionized plasma 232 (FIG. 2C), the pulsed power supply 202 applies a high-power pulse between the cathode 204 and the anode 216. This high-power pulse generates the strong electric field 236 in the region 222 between the cathode 204 and the anode 216. The strong electric field 236 results in collisions occurring between neutral atoms 240, electrons (not shown), and ions 242 in the weakly-ionized plasma 232. These collisions generate numerous excited atoms 244 in the weakly-ionized plasma 232.

The accumulation of excited atoms 244 in the weakly-ionized plasma 232 alters the ionization process. In one embodiment, the strong electric field 236 facilitates a multi-step ionization process of an atomic feed gas that significantly increases the rate at which the strongly-ionized plasma 238 is formed. The multi-step ionization process has an efficiency that increases as the density of excited atoms 244 in the weakly-ionized plasma 232 increases. The strong electric field 236 enhances the formation of ions of a molecular or atomic feed gas.

In one embodiment, the distance or gap 220 between the cathode 204 and the anode 216 is chosen so as to maximize the rate of excitation of the atoms. The value of the electric field 236 in the region 222 depends on the voltage level applied by the pulsed power supply 202 and the size of the gap 220 between the anode 216 and the cathode 204. In some embodiments, the strength of the electric field 236 can vary between about 2V/cm and $10^5$ V/cm depending on various system parameters and operating conditions of the plasma system.

In some embodiments, the gap 220 can be between about 0.30 cm and about 10 cm depending on various parameters of the desired plasma. In one embodiment, the electric field 236 in the region 222 is rapidly applied to the pre-ionized or weakly-ionized plasma 232. In some embodiments, the rapidly applied electric field 236 is generated by applying a voltage pulse having a rise time that is between about 0.1 microsecond and ten seconds.

In one embodiment, the dimensions of the gap 220 and the parameters of the applied electric field 236 are varied in order to determine the optimum condition for a relatively high rate of excitation of the atoms 240 in the region 222. For example, an argon atom requires an energy of about 11.55 eV to become excited. Thus, as the feed gas 226 flows through the region 222, the weakly-ionized plasma 232 is formed and the atoms 240 in the weakly-ionized plasma 232 experience a stepwise ionization process.

The excited atoms 244 in the weakly-ionized plasma 232 then encounter the electrons (not shown) that are in the region 234. The excited atoms 244 only require about 4 eV of energy to ionize while neutral atoms 240 require about 15.76 eV of energy to ionize. Therefore, the excited atoms 244 will ionize at a much higher rate than the neutral atoms 240. In one embodiment, ions 242 in the strongly-ionized plasma 238 strike the cathode 204 causing secondary electron emission from the cathode 204. These secondary electrons interact with neutral 240 or excited atoms 244 in the strongly-ionized plasma 238. This process further increases the density of ions 242 in the strongly-ionized plasma 238 as the feed gas 226 is exchanged.

The multi-step ionization process corresponding to the rapid application of the electric field 236 can be described as follows:

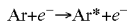

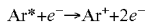

where Ar represents a neutral argon atom 240 in the feed gas 226 and e⁻ represents an ionizing electron generated in response to a pre-ionized plasma 232, when sufficient voltage is applied between the cathode 204 and the anode 216. Additionally, Ar* represents an excited argon atom 244 in the weakly-ionized plasma 232. The collision between the excited argon atom 244 and the ionizing electron results in an argon ion (Ar⁺) and two electrons.

The excited argon atoms 244 generally require less energy to become ionized than neutral argon atoms 240. Thus, the excited atoms 244 tend to more rapidly ionize near the surface of the cathode 204 than the neutral argon atoms 240. As the density of the excited atoms 244 in the plasma increases, the efficiency of the ionization process rapidly increases. This increased efficiency eventually results in an avalanche-like increase in the density of the strongly-ionized plasma 238. Under appropriate excitation conditions, the proportion of the energy applied to the weakly-ionized plasma 232, which is transformed to the excited atoms 244, is very high for a pulsed discharge in the feed gas 226.

Thus, in one aspect of the invention, high-power pulses are applied to a weakly-ionized plasma 232 across the gap 220 to generate the strong electric field 236 between the anode 216 and the cathode 204. This strong electric field 236 generates excited atoms 244 in the weakly-ionized plasma 232. The excited atoms 244 are rapidly ionized by interactions with the secondary electrons that are emitted by the cathode 204. The rapid ionization results in a strongly-ionized plasma 238 having a large ion density being formed in the area 234 proximate to the cathode 204. The strongly-ionized plasma 238 is also referred to as a high-density plasma.

In one embodiment of the invention, a higher density plasma is generated by controlling the flow of the feed gas 226 in the region 222. In this embodiment, a first volume of feed gas 226 is supplied to the region 222. The first volume of feed gas 226 is then ionized to form a weakly-ionized plasma 232 in the region 222. Next, the pulsed power supply 202 applies a high-power electrical pulse across the weakly-ionized plasma 232. The high-power electrical pulse generates a strongly-ionized plasma 238 from the weakly-ionized plasma 232.

The level and duration of the high-power electrical pulse is limited by the level and duration of the power that the strongly-ionized plasma 238 can absorb before the high-power discharge contracts and terminates. In one embodiment, the strength and the duration of the high-power electrical pulse are increased and thus the density of the strongly-ionized plasma 238 is increased by increasing the flow rate of the feed gas 226.

In one embodiment, the strongly-ionized plasma 238 is transported through the region 222 by a rapid volume exchange of feed gas 226. As the feed gas 226 moves through the region 222, it interacts with the moving strongly-ionized plasma 238 and also becomes strongly-ionized from the applied high-power electrical pulse. The ionization process can be a combination of direct ionization and/or stepwise ionization as described herein. Transporting the strongly-ionized plasma 238 through the region 222 by a rapid volume exchange of the feed gas 226 increases the level and the duration of the power that can be applied to the strongly-ionized plasma 238 and, thus, generates a higher density strongly-ionized plasma in the region 234.

The efficiency of the ionization process can be increased by applying a magnetic. field (not shown) proximate to the cathode 204, as described herein. The magnetic field tends to trap electrons in the weakly-ionized plasma 232 and also tends to trap secondary the electrons proximate to the cathode 204. The trapped electrons ionize the excited atoms 244 generating the strongly-ionized plasma 238. In one embodiment, the magnetic field is generated in the region 222 to substantially trap electrons in the area where the weakly-ionized plasma 232 is ignited.

In one embodiment, the plasma generating system 200 can be configured for plasma etching. In another embodiment, the plasma generating system 200 can be configured for plasma sputtering. In particular, the plasma generating system 200 can be used for sputtering magnetic materials. Known magnetron sputtering systems generally are not suitable for sputtering magnetic materials because the magnetic field generated by the magnetron can be absorbed by the magnetic target material. RF diode sputtering is sometimes used to sputter magnetic materials. However, RF diode sputtering generally has poor film thickness uniformity and relatively low deposition rates.

The plasma generating system 200 can be adapted to sputter magnetic materials by including a target assembly having a magnetic target material and by driving that target assembly with an RF power supply (not shown). For example, an RF power supply can provide an RF power that is on order of about 10 kW. A substantially uniform weakly-ionized plasma can be generated by applying RF power across a feed gas that is located proximate to the target assembly. The strongly-ionized plasma is generated by applying a strong electric field across the weakly-ionized plasma as described herein. The RF power supply applies a negative voltage bias to the target assembly. Ions in the strongly-ionized plasma bombard the target material thereby causing sputtering.

The plasma generating system 200 can also be adapted to sputter dielectric materials. Dielectric materials can be sputtered by driving a target assembly including a dielectric target material with an RF power supply (not shown). For example, an RF power supply can provide an RF power that is on order of about 10 kW. A substantially uniform weakly-ionized plasma can be generated by applying RF power across a feed gas that is located proximate to the target assembly.

In another embodiment, a DC power supply (not shown) is used to create a weakly-ionized plasma 232 according to the present invention. In this embodiment, the dielectric target material is positioned relative to the cathode 204 such that an area of the cathode 204 can conduct a direct current between the anode 216 and the cathode 204.

In one embodiment, a magnetic field is generated proximate to the target assembly in order to trap electrons in the weakly-ionized plasma. The strongly-ionized plasma is generated by applying a strong electric field across the weakly-ionized plasma as described herein. The RF power supply applies a negative voltage bias to the target assembly. Ions in the strongly-ionized plasma bombard the target material thereby causing sputtering.

In one embodiment, a strongly-ionized plasma 238 according to the present invention is used to generate an ion beam. An ion beam source according to the present invention includes the plasma generating apparatus described herein and an additional electrode (not shown) that is used to accelerate ions in the plasma. In one embodiment, the external electrode is a grid. The ion beam source according to the present invention can generate a very high-density ion flux. For example, the ion beam source can generate ozone flux. Ozone is a highly reactive oxidizing agent that can be used for many applications such as cleaning process chambers, deodorizing air, purifying water, and treating industrial wastes.

Figure 3:
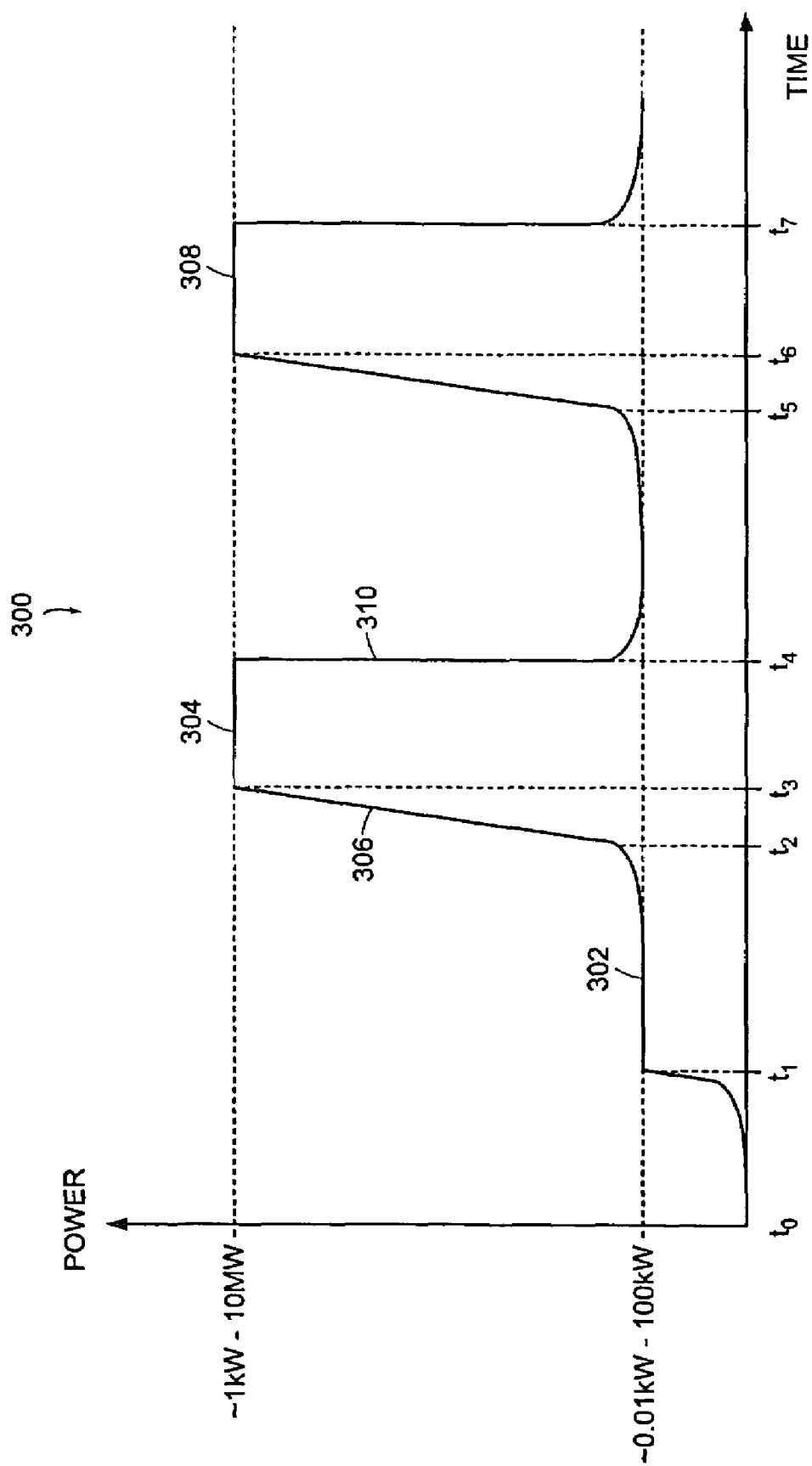
FIG. 3 illustrates a graphical representation of the pulse power as a function of time for periodic pulses applied to the plasma in the plasma generating apparatus of FIG. 2A.

FIG. 3 illustrates a graphical representation 300 of the applied power of a pulse as a function of time for periodic pulses applied to the plasma in the plasma generating apparatus 200 of FIG. 2A. At time $t_0$, the feed gas 226 flows between the cathode 204 and the anode 216 before the pulsed power supply 202 is activated. The time required for a sufficient quantity of gas 226 to flow between the cathode 204 and the anode 216 depends on several factors including the flow rate of the gas 226 and the desired pressure in the region 222.

In one embodiment (not shown), the pulsed power supply 202 is activated before the feed gas 226 flows into the region 222. In this embodiment, the feed gas 226 is injected between the anode 216 and the cathode 204 where it is ignited by the pulsed power supply 202 to generate the weakly-ionized plasma 232.

In one embodiment, the feed gas 226 flows between the anode 216 and the cathode 204 between time $t_0$ and time $t_1$. At time $t_1$, the pulsed power supply 202 generates a pulse 302 between the cathode 204 and the anode 216 that has a power between about 0.01 kW and 100 kW depending on the volume of the plasma. The pulse 302 is sufficient to ignite the feed gas 226 to generate the weakly-ionized plasma 232.

In one embodiment (not shown), the pulsed power supply 202 applies a potential between the cathode 204 and the anode 216 before the feed gas 226 is delivered into the region 222. In this embodiment, the feed gas 226 is ignited as it flows between the cathode 204 and the anode 216. In other embodiments, the pulsed power supply 202 generates the pulse 302 between the cathode 204 and the anode 216 during or after the feed gas 226 is delivered into the region 222.

The power generated by the pulsed power supply 202 partially ionizes the feed gas 226 that is located in the region 222 between the cathode 204 and the anode 216. The partially ionized gas is also referred to as a weakly-ionized plasma or a pre-ionized plasma 232 (FIG. 2B). The formation of the weakly-ionized plasma 232 substantially eliminates the possibility of creating a breakdown condition when high-power pulses are applied to the weakly-ionized plasma 232 as described herein.

In one embodiment, the power is continuously applied for between about one microsecond and one hundred seconds to allow the pre-ionized plasma 232 to form and to be maintained at a sufficient plasma density. In one embodiment, the power from the pulsed power supply 202 is continuously applied after the weakly-ionized plasma 232 is ignited in order to maintain the weakly-ionized plasma 232. The pulsed power supply 202 can be designed so as to output a continuous nominal power in order to generate and sustain the weakly-ionized plasma 232 until a high-power pulse is delivered by the pulsed power supply 202.

At time $t_2$, the pulsed power supply 202 delivers a high-power pulse 304 across the weakly-ionized plasma 232. In some embodiments, the high-power pulse 304 has a power that is in the range of between about 1 kW and 10 MW depending on parameters of the plasma generating apparatus 200. The high-power pulse has a leading edge 306 having a rise time of between about 0.1 microseconds and ten seconds. The high-power pulse 304 has a power and a pulse width that is sufficient to transform the weakly-ionized plasma 232 to a strongly-ionized plasma 238 (FIG. 2D). The strongly-ionized plasma 238 is also referred to as a high-density plasma. In one embodiment, the high-power pulse 304 is applied for a time that is in the range of between about ten microseconds and ten seconds. At time $t_4$, the high-power pulse 304 is terminated.

The power supply 202 maintains the weakly-ionized plasma 232 after the delivery of the high-power pulse 304 by applying background power that, in one embodiment, is between about 0.01 kW and 100 kW. The background power can be a pulsed or continuously applied power that maintains the pre-ionization condition in the plasma, while the pulsed power supply 202 prepares to deliver another high-power pulse 308.

At time $t_5$, the pulsed power supply 202 delivers another high-power pulse 308. The repetition rate between the high-power pulses 304, 308 is, in one embodiment, between about 0.1 Hz and 1 kHz. The particular size, shape, width, and frequency of the high-power pulses 304, 308 depend on various factors including process parameters, the design of the pulsed power supply 202, the design of the plasma generating apparatus 200, the volume of the plasma, and the pressure in the chamber. The shape and duration of the leading edge 306 and the trailing edge 310 of the high-power pulse 304 is chosen to sustain the weakly-ionized plasma 232 while controlling the rate of ionization of the strongly-ionized plasma 238.

In one embodiment, the particular size, shape, width, and frequency of the high-power pulse 304 is chosen to control the density of the strongly-ionized plasma 238. In one embodiment, the particular size, shape, width, and frequency of the high-power pulse 304 is chosen to control the etch rate of a substrate (not shown). In one embodiment, the particular size, shape, width, and frequency of the high-power pulse 304 is chosen to control the rate of sputtering of a sputtering target (not shown).

Figure 4:
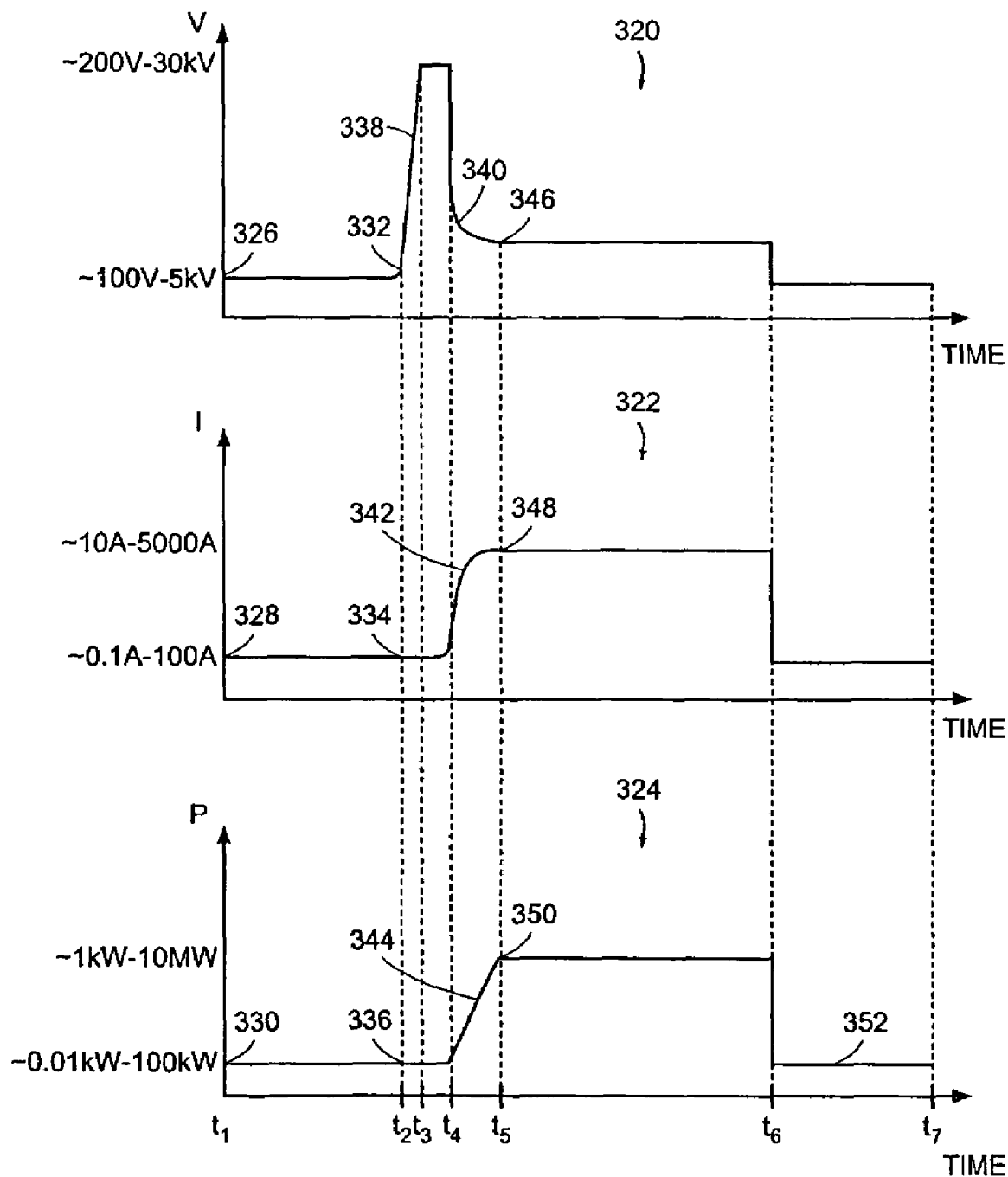
FIG. 4 illustrates graphical representations of the applied voltage, current, and power as a function of time for periodic pulses applied to the plasma in the plasma generating apparatus of FIG. 2A.

FIG. 4 illustrates graphical representations 320, 322, and 324 of the absolute value of applied voltage, current, and power, respectively, as a function of time for periodic pulses applied to the plasma in the plasma generating apparatus 200 of FIG. 2A. In one embodiment, at time $t_0$ (not shown), the feed gas 226 flows proximate to the cathode 204 before the pulsed power supply 202 is activated. The time required for a sufficient quantity of feed gas 226 to flow proximate to the cathode 204 depends on several factors including the flow rate of the feed gas 226 and the desired pressure in the region 222.

In the embodiment shown in FIG. 4, the power supply 202 generates a constant power. At time $t_1$, the pulsed power supply 202 generates a voltage 326 across the anode 216 and the cathode 204. In one embodiment, the voltage 326 is approximately between 100V and 5 kV. The period between time $t_0$ and time $t_1$ (not shown) can be on the order of several microseconds up to several milliseconds. At time $t_1$, the current 328 and the power 330 have constant value.

Between time $t_1$ and time $t_2$, the voltage 326, the current 328, and the power 330 remain constant as the weakly-ionized plasma 232 (FIG. 2B) is generated. The voltage 332 at time $t_2$ is between about 100V and 5 kV. The current 334 at time $t_2$ is between about 0.1 A and 10 A. The power 336 delivered at time $t_2$ is between about 0.01 kW and 100 kW.

The power 336 generated by the pulsed power supply 202 partially ionizes the gas 226 that is located in the region 222 between the cathode 204 and the anode 216. The partially ionized gas is also referred to as a weakly-ionized plasma or a pre-ionized plasma 232. As described herein, the formation of weakly-ionized plasma 232 substantially eliminates the possibility of creating a breakdown condition when high-power pulses are applied to the weakly-ionized plasma 232. The suppression of this breakdown condition substantially eliminates the occurrence of undesirable arcing between the anode 216 and the cathode 204.

In one embodiment, the period between time $t_1$ and time $t_2$ is between about one microsecond and one hundred seconds to allow the pre-ionized plasma 232 to form and be maintained at a sufficient plasma density. In one embodiment, the power 336 from the pulsed power supply 202 is continuously applied to maintain the weakly-ionized plasma 232. The pulsed power supply 202 can be designed so as to output a continuous nominal power into order to sustain the weakly-ionized plasma 232.

Between time $t_2$ and time $t_3$, the pulsed power supply 202 delivers a large voltage pulse 338 across the weakly-ionized plasma 232. In some embodiments, the large voltage pulse 338 has a voltage that is in the range of 200V to 30 kV. In some embodiments, the period between time $t_2$ and time $t_3$ is between about 0.1 microseconds and ten seconds. The large voltage pulse 338 is applied between time $t_3$ and time $t_4$, before the current across the weakly-ionized plasma 232 begins to increase. In one embodiment, the period between time $t_3$ and time $t_4$ can be between about ten nanoseconds and one microsecond.

Between time $t_4$ and time $t_5$, the voltage 340 drops as the current 342 increases. The power 344 also increases between time $t_4$ and time $t_5$, until a quasi-stationary state exists between the voltage 346 and the current 348. The period between time $t_4$ and time $t_5$ can be on the order of hundreds of nanoseconds.

In one embodiment, at time $t_5$, the voltage 346 is between about 50V and 30 kV thousand volts, the current 348 is between about 10 A and 5 kA and the power 350 is between about 1 kW and 10 MW. The power 350 is continuously applied to the plasma until time $t_6$. In one embodiment, the period between time $t_5$ and time $t_6$ is approximately between one microsecond and ten seconds.

The pulsed power supply 202 delivers a high-power pulse having a maximum power 350 and a pulse width that is sufficient to transform the weakly-ionized plasma 232 to a strongly-ionized plasma 238 (FIG. 2D). At time $t_6$, the maximum power 350 is terminated. In one embodiment, the pulsed power supply 202 continues to supply a background power that is sufficient to maintain the plasma after time $t_6$.

In one embodiment, the power supply 202 maintains the plasma after the delivery of the high-power pulse by continuing to apply a power 352 that can be between about 0.01 kW and 100 kW to the plasma. The continuously generated power maintains the pre-ionization condition in the plasma, while the pulsed power supply 202 prepares to deliver the next high-power pulse.

At time $t_7$, the pulsed power supply 202 delivers the next high-power pulse (not shown). In one embodiment, the repetition rate between the high-power pulses is between about 0.1 Hz and 1 kHz. The particular size, shape, width, and frequency of the high-power pulses depend on various factors including process parameters, the design of the pulsed power supply 202, the design of the plasma generating system 200, the volume of plasma, the density of the strongly-ionized plasma 238, and the pressure in the region 222.

In another embodiment (not shown), the power supply 202 generates a constant voltage. In this embodiment, the applied voltage 320 is continuously applied from time $t_2$ until time $t_6$. The current 322 and the power 324 rise until time $t_6$ in order to maintain a constant voltage level, and then the voltage 320 is terminated. The parameters of the current, power and voltage are optimized for generating exited atoms.

In one embodiment of the invention, the efficiency of the ionization process is increased by generating a magnetic field proximate to the cathode 204. The magnetic field tends to trap electrons in the weakly-ionized plasma 232 proximate to the cathode 204. The trapped electrons ionize the excited atoms 244 thereby generating the strongly-ionized plasma 238. In this embodiment, magnetically enhanced plasma has strong diamagnetic properties. The term "strong diamagnetic properties" means that the magnetically enhanced high-density plasma discharge tends to exclude external magnetic fields from the plasma volume.

FIG. 5A through FIG. 5D illustrate various simulated magnetic field distributions 400, 402, 404, and 406 proximate to the cathode 204 for various electron ExB drift currents in a magnetically enhanced plasma generating apparatus according to one embodiment of the invention. The magnetically enhanced plasma generating apparatus includes a magnet assembly 407 that is positioned proximate to the cathode 204. The magnet assembly 407 generates a magnetic field proximate to the cathode 204. In one embodiment, the strength of the magnetic field is between about fifty and two thousand gauss. The simulated magnetic fields distributions 400, 402, 404, and 406 indicate that high-power plasmas having high current density tend to diffuse homogeneously in an area 234' of the magnetically enhanced plasma generating apparatus.

The high-power pulses between the cathode 204 and the anode 216 generate secondary electrons from the cathode 204 that move in a substantially circular motion proximate to the cathode 204 according to crossed electric and magnetic fields. The substantially circular motion of the electrons generates an electron ExB drift current. The magnitude of the electron ExB drift current is proportional to the magnitude of the discharge current in the plasma and, in one embodiment, is approximately in the range of between about three and ten times the magnitude of the discharge current.

In one embodiment, the substantially circular electron ExB drift current generates a magnetic field that interacts with the magnetic field generated by the magnet assembly 407. In one embodiment, the magnetic field generated by the electron ExB drift current has a direction that is substantially opposite to the magnetic field generated by the magnet assembly 407. The magnitude of the magnetic field generated by the electron ExB drift current increases with increased electron ExB drift current. The homogeneous diffusion of the strongly-ionized plasma in the region 234' is caused, at least in part, by the interaction of the magnetic field generated by the magnet assembly 407 and the magnetic field generated by the electron ExB drift current.

In one embodiment, the electron ExB drift current defines a substantially circular shape for low current density plasma. However, as the current density of the plasma increases, the substantially circular electron ExB drift current tends to have a more complex shape as the interaction of the magnetic field generated by the magnet assembly 407, the electric field generated by the high-power pulse, and the magnetic field generated by the electron ExB drift current becomes more acute. For example, in one embodiment, the electron ExB drift current has a substantially cycloidal shape. The exact shape of the electron ExB drift current can be quite elaborate and depends on various factors.

Figure 5A:
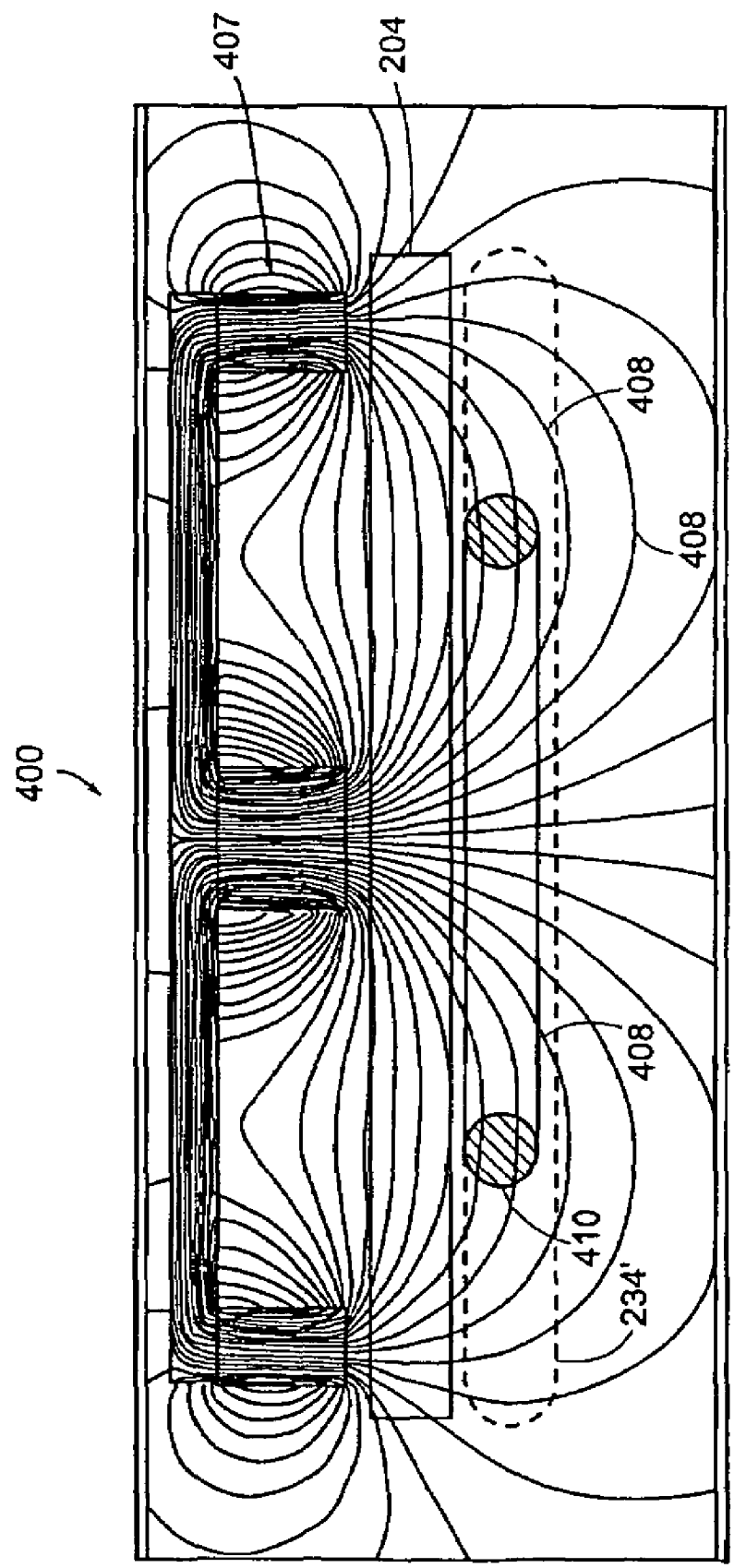
FIG. 5A through FIG. 5D illustrate various simulated magnetic field distributions proximate to the cathode for various electron ExB drift currents according to the present invention.

For example, FIG. 5A illustrates the magnetic field lines 408 produced from the interaction of the magnetic field generated by the magnet assembly 407 and the magnetic field generated by an electron ExB drift current 410 illustrated by a substantially circularly shaped ring. The electron ExB drift current 410 is generated proximate to the cathode 204.

In the example shown in FIG. 5A, the electron ExB drift current 410 is approximately 100 A. In one embodiment of the invention, the electron ExB drift current 410 is between approximately three and ten times as great as the discharge current. Thus, in the example shown in FIG. 5A, the discharge current is approximately between 10 A and 30 A. The magnetic field lines 408 shown in FIG. 5A indicate that the magnetic field generated by the magnet assembly 407 is substantially undisturbed by the relatively small magnetic field that is generated by the relatively small electron ExB drift current 410.

Figure 5B:
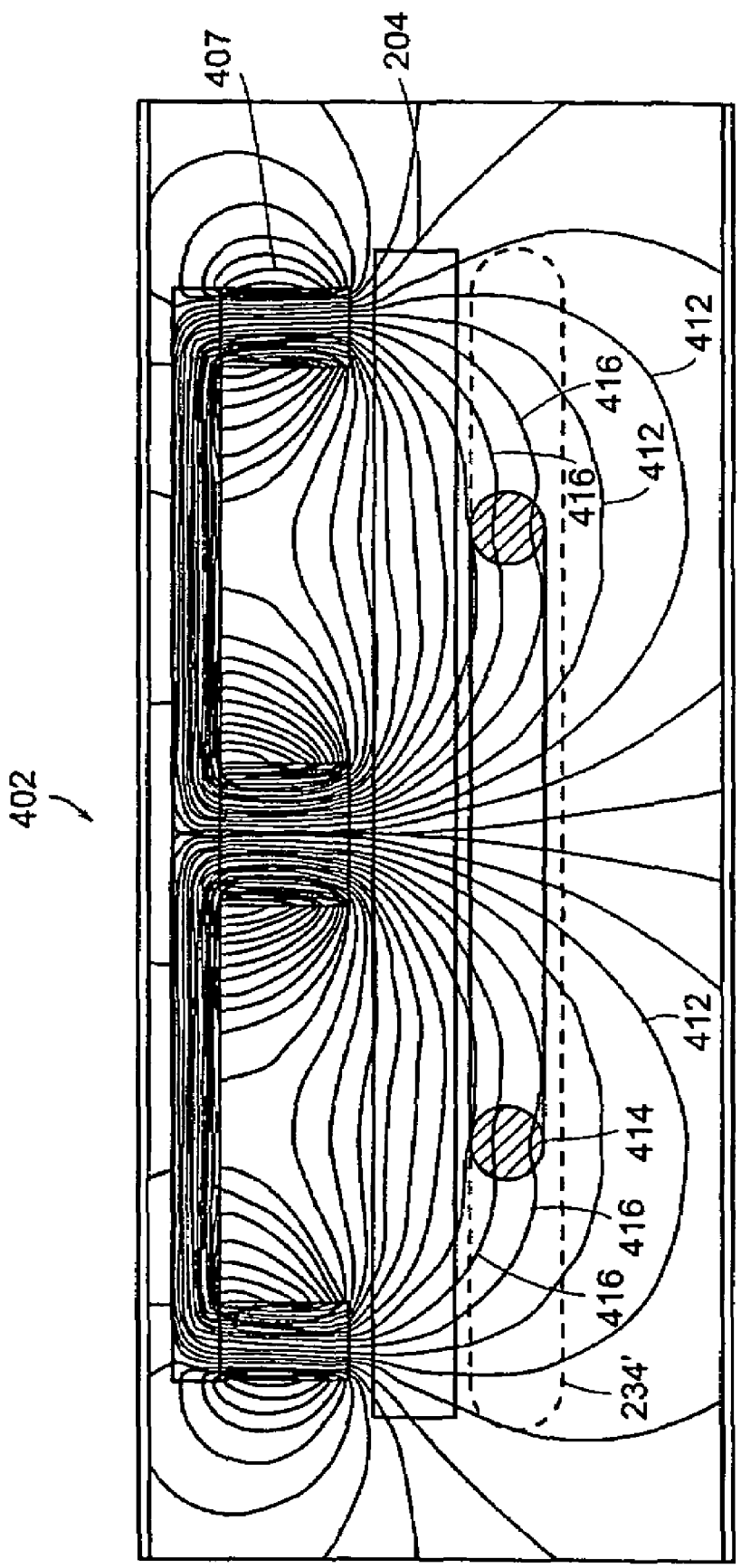

FIG. 5B illustrates the magnetic field lines 412 produced from the interaction of the magnetic field generated by the magnet assembly 407 and the magnetic field generated by an electron ExB drift current 414. The electron ExB drift current 414 is generated proximate to the cathode 204. In the example shown in FIG. 5B, the electron ExB drift current 414 is approximately 300 A. Since the electron ExB drift current 414 is typically between about three and ten times as great as the discharge current, the discharge current in this example is approximately between 30 A and 100 A.

The magnetic field lines 412 that are generated by the magnet assembly 407 are substantially undisturbed by the relatively small magnetic field generated by the relatively small electron ExB drift current 414. However, the magnetic field lines 416 that are closest to the electron ExB drift current 414 are somewhat distorted by the magnetic field generated by the electron ExB drift current 414. The distortion suggests that a larger electron ExB drift current should generate a stronger magnetic field that will interact more strongly with the magnetic field generated by the magnet assembly 407.

Figure 5C:
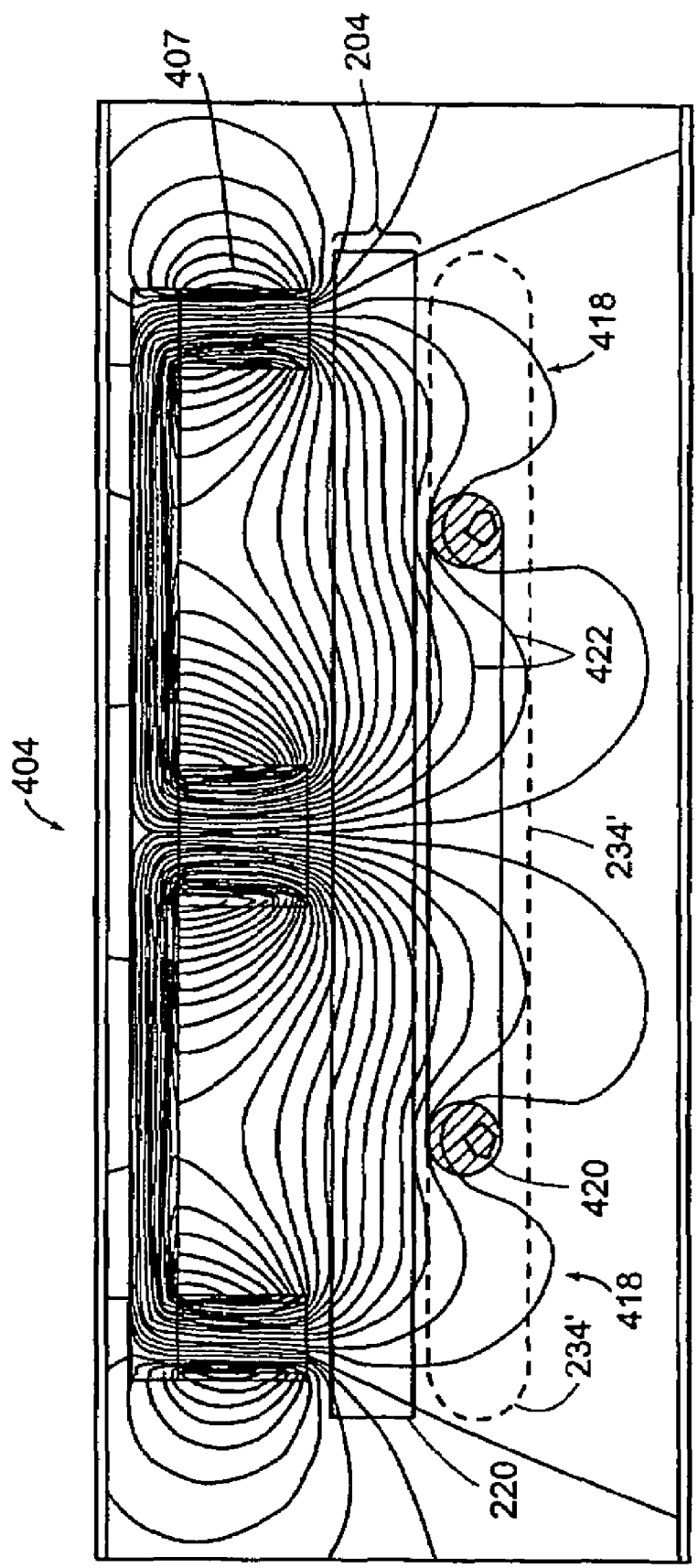

FIG. 5C illustrates the magnetic field lines 418 that are produced from the interaction of the magnetic field generated by the magnet assembly 407 and the magnetic field generated by an electron ExB drift current 420. The electron ExB drift current 420 is generated proximate to the cathode 204. In the example shown in FIG. 5C, the electron ExB drift current 420 is approximately 1,000 A. Since the electron ExB drift current 420 is typically between about three and ten times as great as the discharge current, the discharge current in this example is approximately between 100 A and 300 A.

The magnetic field lines 418 that are generated by the magnet assembly 407 exhibit substantial distortion that is caused by the relatively strong magnetic field generated by the relatively large electron ExB drift current 420. Thus, the larger electron ExB drift current 420 generates a stronger magnetic field that strongly interacts with and can begin to dominate the magnetic field generated by the magnet assembly 407.

The interaction of the magnetic field generated by the magnet assembly 407 and the magnetic field generated by the electron ExB drift current 420 generates magnetic field lines 422 that are somewhat more parallel to the surface of the cathode 204 than the magnetic field lines 408, 412, and 416 in FIG. 5A and FIG. 5B. The magnetic field lines 422 allow the strongly-ionized plasma 238 to more uniformly distribute itself in the area 234'. Thus, the strongly-ionized plasma 238 is substantially uniformly diffused in the area 234'.

Figure 5D:
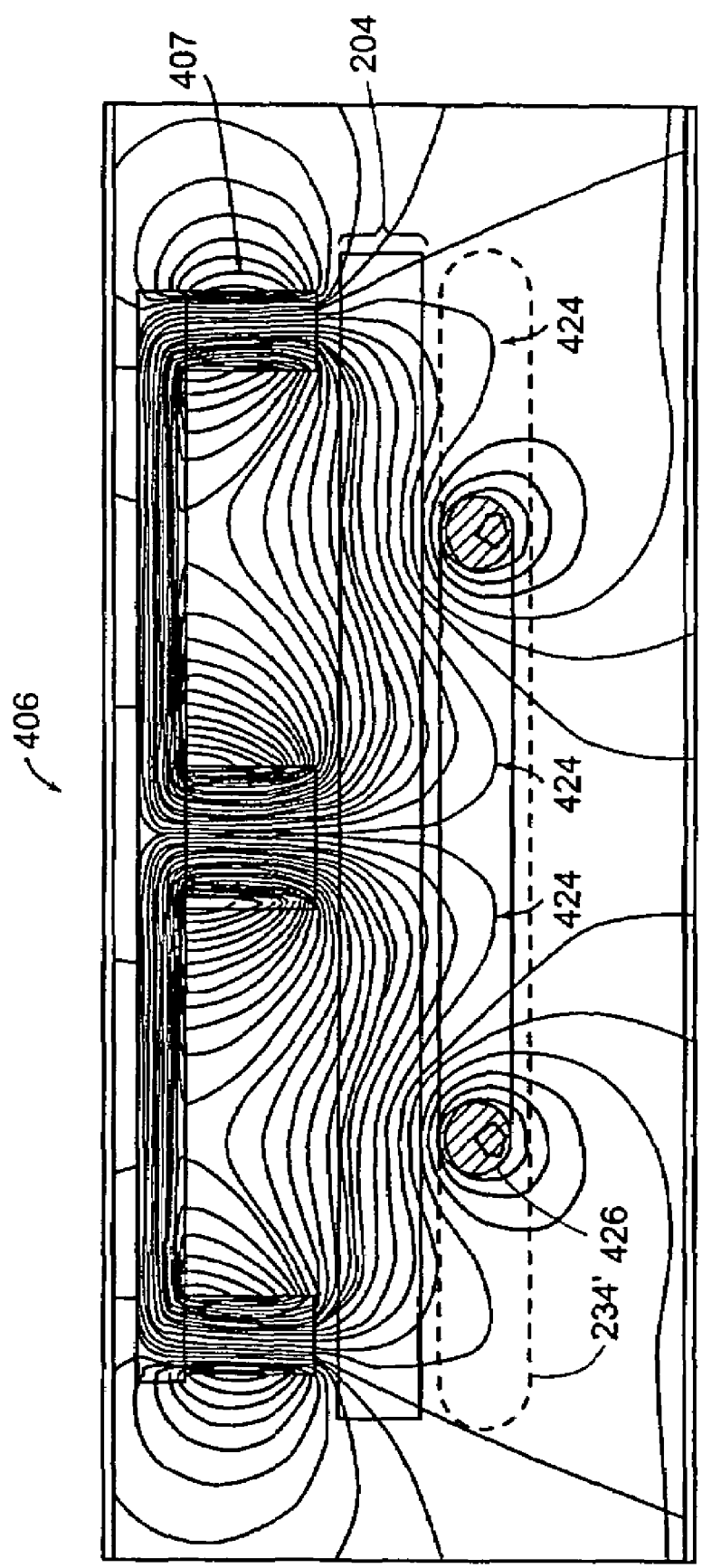

FIG. 5D illustrates the magnetic field lines 424 produced from the interaction of the magnetic field generated by the magnet assembly 407 and the magnetic field generated by an electron ExB drift current 426. The electron ExB drift current 426 is generated proximate to the cathode 204. In the example shown in FIG. 5D, the electron ExB drift current 426 is approximately 5 kA. The discharge current in this example is approximately between 500 A and 1,700 A.

The magnetic field lines 424 generated by the magnet assembly 407 are relatively distorted due to their interaction with the relatively strong magnetic field generated by the relatively large electron ExB drift current 426. Thus, in this embodiment, the relatively large electron ExB drift current 426 generates a very strong magnetic field that is stronger than the magnetic field generated by the magnet assembly 407.

FIG. 6A through FIG. 6D illustrate cross-sectional views of alternative embodiments of plasma generating systems 200', 200'', 200''' and 200'''', according to the present invention. The plasma generating system 200' of FIG. 6A includes an electrode 452 that generates a weakly-ionized or pre-ionized plasma. The electrode 452 is also referred to as a pre-ionizing filament electrode and is a component in an ionization source that generates the weakly-ionized plasma.

In one embodiment, the electrode 452 is coupled to an output 454 of a power supply 456. The power supply 456 can be a DC power supply or an AC power supply. An insulator 458 isolates the electrode 452 from the anode 216. In one embodiment, the electrode 452 is substantially shaped in the form of a ring electrode. In other embodiments, the electrode 452 is substantially shaped in a linear form or any other shape that is suitable for pre-ionizing the plasma.

In one embodiment, a second output 460 of the power supply 456 is coupled to the cathode 204. The insulator 218 isolates the cathode 204 from the anode 216. In one embodiment, the power supply 456 generates an average output power that is in the range of between about 0.01 kW and 100 kW. Such an output power is sufficient to generate a suitable current between the electrode 452 and the cathode 204 to pre-ionize feed gas 226 that is located proximate to the electrode 452.

In operation, the plasma generating apparatus 200' functions in a similar manner to the plasma generating apparatus 200 of FIG. 2A, but with some operational differences. In one embodiment (not shown) a magnetic field is generated proximate to the cathode 204. In one embodiment, the strength of the magnetic field is between about fifty and two thousand gauss. The feed gas 226 is supplied proximate to the electrode 452 and the cathode 204.

The power supply 456 applies a suitable current between the cathode 204 and the electrode 452. The parameters of the current are chosen to establish a weakly-ionized plasma in the region 234 proximate to the electrode 452. In one embodiment, the power supply 456 generates a voltage of between about 100V and 5 kV with a discharge current that is between about 0.1 A and 100 A depending on the size of the system. An example of specific parameters of the voltage will be discussed herein in more detail in connection with FIG. 7.

In one embodiment, the resulting pre-ionized plasma density is in the range between approximately $10^6$ and $10^{12}$ $cm^{-3}$ for argon sputtering gas. In one embodiment, the pressure in the region 234 is in the range of approximately $10^{-3}$ to 10 Torr or higher. The pressure can vary depending on various system parameters, such as the presence of a magnetic field proximate to the cathode 204. As previously discussed, the weakly-ionized or pre-ionized plasma substantially eliminates the possibility of establishing a breakdown condition between the cathode 204 and the anode 216 when high-power pulses are applied to the plasma.

The pulsed power supply 202 then generates a high-power pulse between the cathode 204 and the anode 216. The high-power pulse generates a strongly-ionized plasma from the weakly-ionized plasma. The parameters of the high-power pulse depend on various parameters including the volume of the plasma, the desired plasma density, and the pressure in the region 234.

In one embodiment, the high-power pulse between the cathode 204 and the anode 216 is in the range of about 1 kW to about 10 MW. In one embodiment, the discharge current density that can be generated from the strongly-ionized plasma is greater than about 1 A/cm$^2$ for a pressure of approximately 10 mTorr.

In one embodiment, the high-power pulse has a pulse width that is in the range of approximately one microsecond to several seconds. In one embodiment, the repetition rate of the high-power discharge is in the range of between about 0.1 Hz to 10 kHz. In one embodiment, the average power generated by the pulsed power supply is less than 1 MW depending on the size of the system. In one embodiment, the thermal energy in the cathode 204 and/or the anode 216 can be conducted away or dissipated by liquid or gas cooling (not shown).

In one embodiment (not shown), a magnetic field is generated proximate to the cathode 204. The strongly-ionized plasma tends to diffuse homogenously in the area 234 due to the interaction of generated magnetic fields, as described herein in connection with FIG. 5A though FIG. 5D.

Figure 6A:
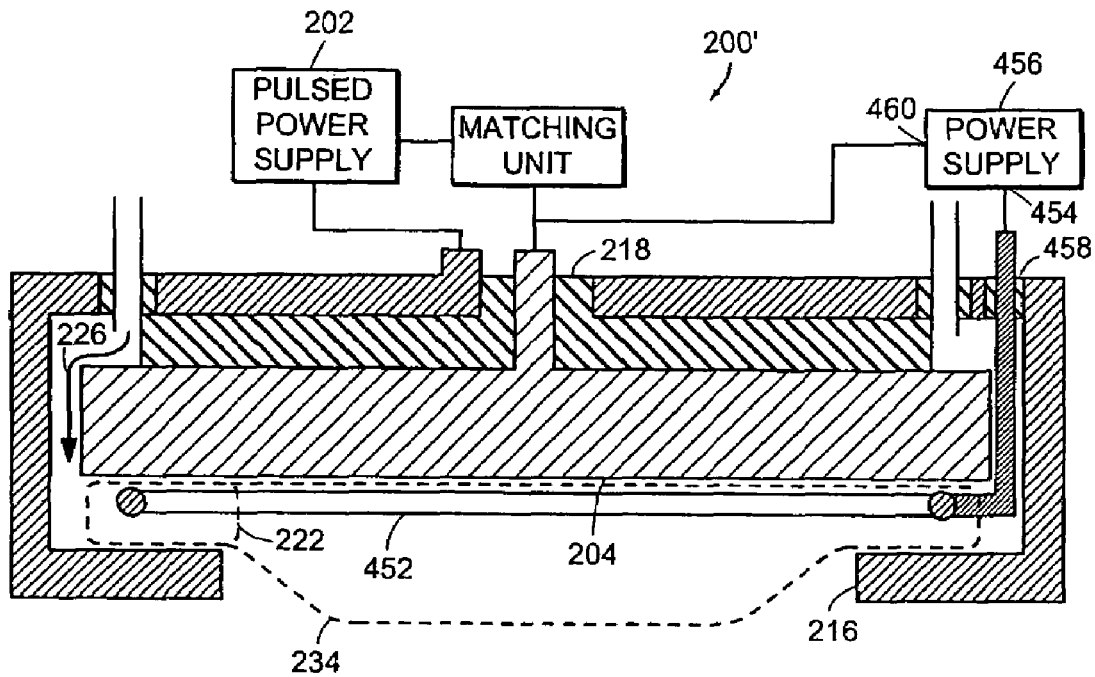
FIG. 6A through FIG. 6D illustrate cross-sectional views of various embodiments of plasma generating systems according to the present invention.
Figure 6B:
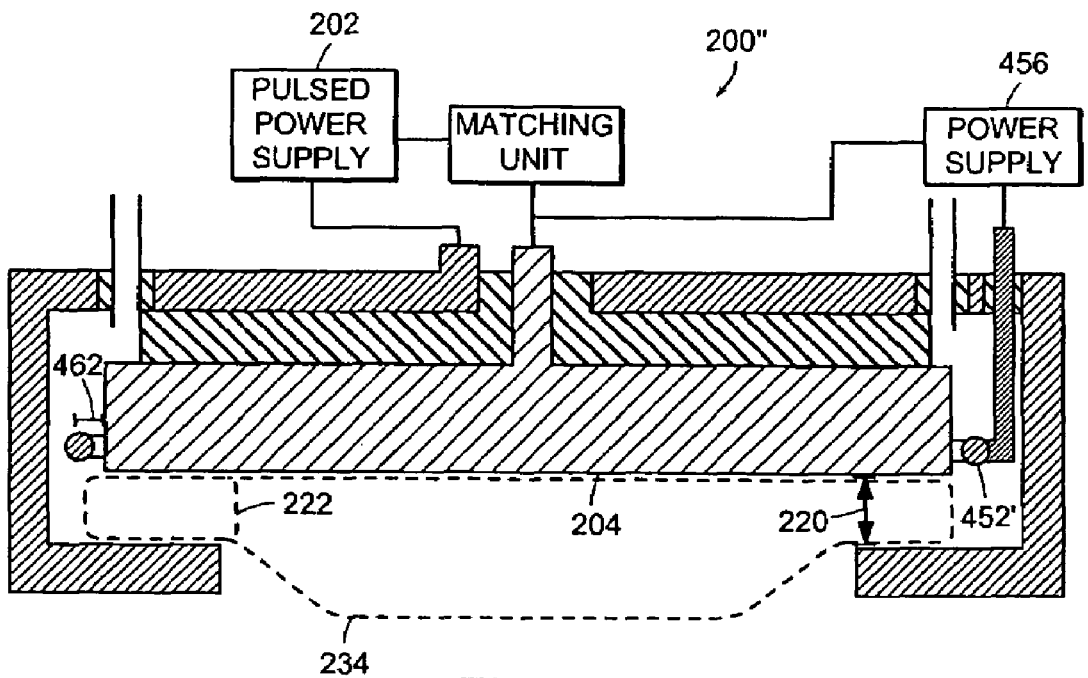

FIG. 6B is a cross-sectional view of another embodiment of a plasma generating apparatus 200″ according to the present invention. This embodiment is similar to the plasma generating apparatus 200′ of FIG. 6A. However, in this embodiment, the electrode 452′, which is a component of the ionization source, substantially surrounds the cathode 204. The position of the electrode 452′ relative to the cathode 204 is chosen to achieve particular electrical conditions in the gap 220 between the anode 216 and the cathode 204.

For example, a distance 462 between the electrode 452′ and the cathode 204 can be varied by changing the diameter of the electrode 452′. In one embodiment, the distance 462 can be varied from about 0.1 cm to about 10 cm. The distance 462 can be optimized to generate a sustainable weakly-ionized plasma in the region 234. The vertical position of the electrode 452′ relative to the cathode 204 can also be varied.

The pre-ionizing electrode 452′ is not physically located in the region 222 between the anode 216 and the cathode 204. Therefore, the pre-ionizing electrode 452′ does not interfere with the strong electric field that results when a high-power pulse from the pulsed power supply 202 is applied between the anode 216 and the cathode 204. Additionally, the location of the pre-ionizing electrode 452′ results in a more uniformly distributed weakly-ionized plasma in the region 234.

In operation, the power supply 456 applies a voltage between the cathode 204 and the electrode 452′. The voltage generates a weakly-ionized or pre-ionized plasma proximate to the electrode 452′ and the cathode 204. The pre-ionized plasma substantially eliminates the possibility of establishing a breakdown condition when high-power pulses from the pulsed power supply 202 are applied to the plasma.

In one embodiment, the power supply 456 is a DC power supply that generates a DC voltage that is in the range of between about 100V and 5 kV with a discharge current that is in the range of between about 0.1 A and 100 A. In another embodiment, the power supply 456 is an AC power supply that generates voltage pulses between the cathode 204 and the electrode 452′.

Figure 6C:
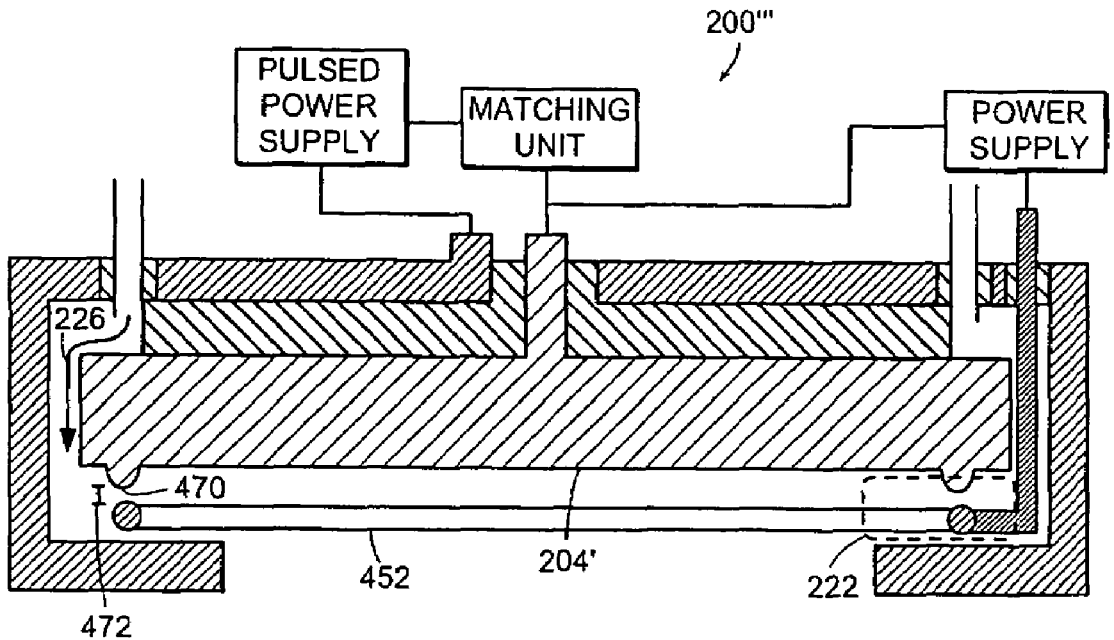

FIG. 6C is a cross-sectional view of another embodiment of a plasma generating apparatus 200‴ according to the present invention. The configuration of the electrode 452 and the cathode 204′ can affect the parameters of the electric field generated between the electrode 452 and the cathode 204′. The parameters of the electric field can influence the ignition of the pre-ionized plasma as well as the pre-ionization process generally. This embodiment creates the necessary conditions for breakdown of the feed gas and ignition of the weakly-ionized plasma in the region 222 between the anode 216 and the cathode 204′.

In the embodiment illustrated by FIG. 6C, the electric field lines (not shown) generated between the cathode 204′ and the electrode 452 are substantially perpendicular to the cathode 204′ at the point 470 on the cathode 204′. The electric field in the gap 472 between the electrode 452 and the cathode 204′ is adapted to ignite the plasma from the feed gas 226 flowing through the gap 472. The efficiency of the pre-ionization process can be increased using this embodiment depending upon parameters, such as the magnetic field strength and the pressure in the area proximate to the cathode 204′.

Figure 6D:
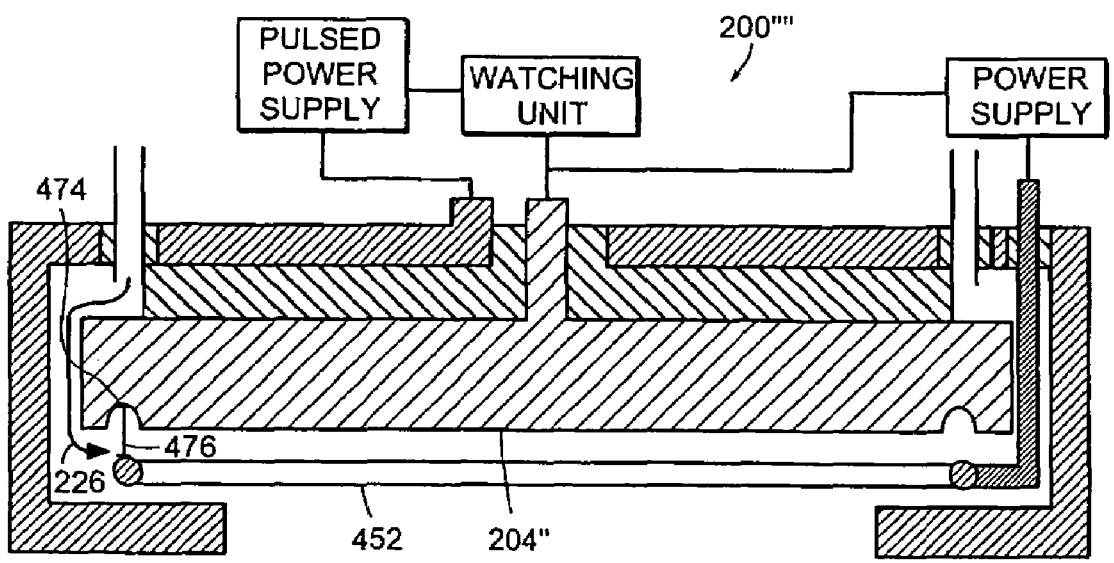

FIG. 6D is a cross-sectional view of another embodiment of a plasma generating apparatus 200″″ according to the present invention. In this embodiment, the electric field lines (not shown) generated between the cathode 204″ and the electrode 452 are substantially perpendicular to the cathode 204″ at the point 474. The electric field in the gap 476 between the electrode 452 and the cathode 204″ is adapted to ignite the plasma from the feed gas 226 flowing through the gap 476. The efficiency of the pre-ionization process can be increased using this embodiment depending upon parameters, such as the magnetic field strength and the pressure in the area proximate to the cathode 204″.

Figure 7:
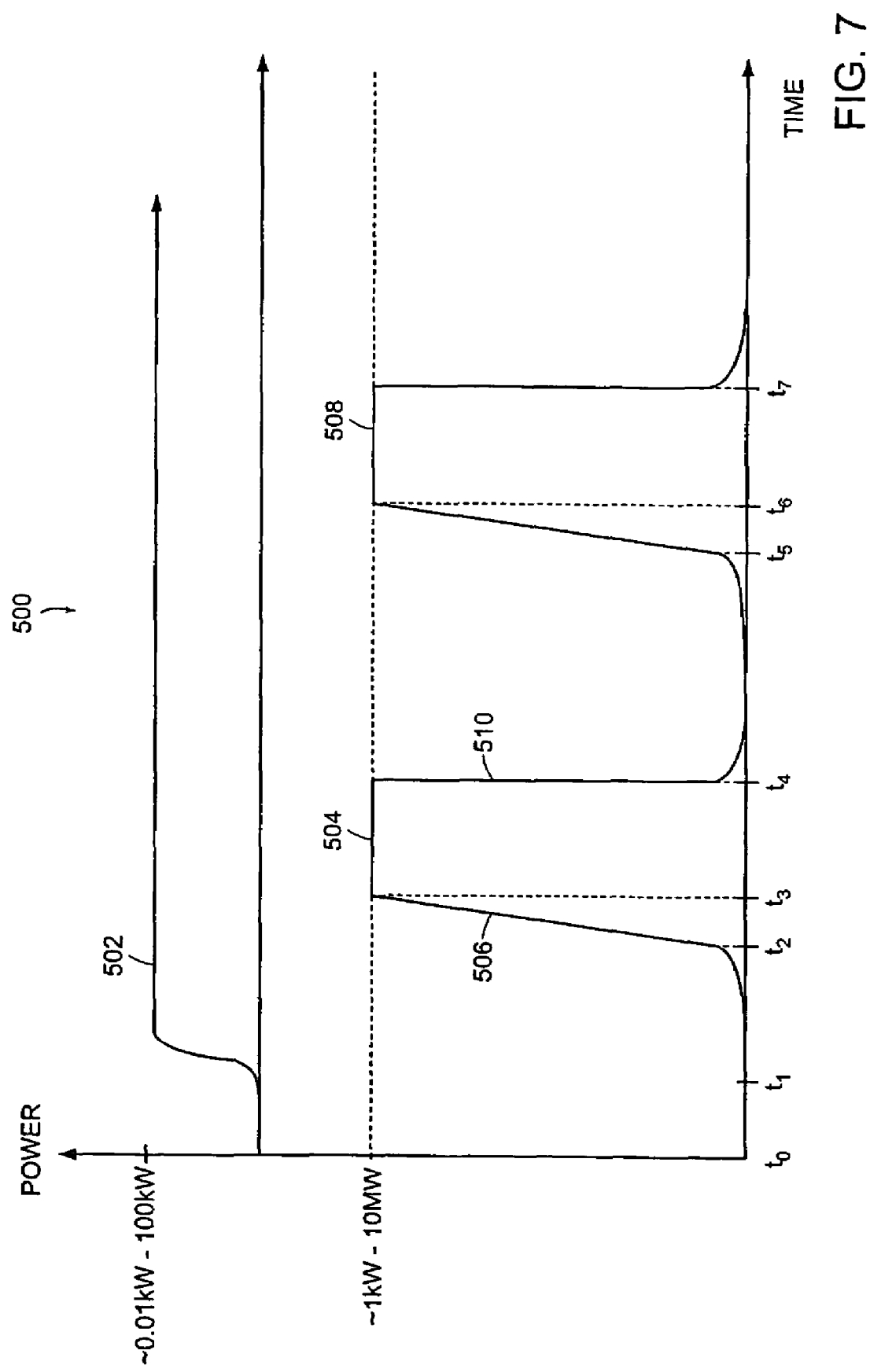
FIG. 7 illustrates a graphical representation of the pulse power as a function of time for periodic pulses applied to the plasma in the plasma generating system of FIG. 6A.

FIG. 7 illustrates a graphical representation 500 of the pulse power as a function of time for periodic pulses applied to the plasma in the plasma generating system 200′ of FIG. 6A. In one embodiment, the feed gas 226 flows in the region 222 proximate to the electrode 452 at time $t_0$, before either the power supply 456 or the pulsed power supply 202 are activated.

In another embodiment, the power supply 456 and/or the pulsed power supply 202 are activated at time $t_0$ before the gas 226 flows in the region 222 proximate to the electrode 452. In this embodiment, the feed gas 226 is injected between the electrode 452 and the cathode 204 where it is ignited by the power supply 456 to generate the weakly-ionized plasma.

The time required for a sufficient quantity of gas 226 to flow into the region 222 depends on several factors including the flow rate of the gas 226 and the desired operating pressure. At time $t_1$, the power supply 456 generates a power 502 that is in the range of between about 0.01 kW to about 100 kW between the electrode 452 and the cathode 204. The power 502 causes the gas 226 proximate to the electrode 452 to become partially ionized, thereby generating a weakly-ionized plasma or a pre-ionized plasma.

At time $t_2$, the pulsed power supply 202 delivers a high-power pulse 504 to the weakly-ionized plasma that is on the order of less than 1 kW to about 10 MW depending on the volume of the plasma and the operating pressure. The high-power pulse 504 is sufficient to transform the weakly-ionized plasma to a strongly-ionized plasma. The high-power pulse has a leading edge 506 having a rise time that is between about 0.1 microseconds and ten seconds.

In one embodiment, the pulse width of the high-power pulse 504 is in the range of between about one microsecond and ten seconds. The high-power pulse 504 is terminated at time $t_4$. Even after the delivery of the high-power pulse 504, the power 502 from the power supply 456 is continuously applied to sustain the pre-ionized plasma, while the pulsed power supply 202 prepares to deliver another high-power pulse 508. In another embodiment (not shown), the power supply 456 is an AC power supply and delivers suitable power pulses to ignite and sustain the weakly-ionized plasma.

At time $t_5$, the pulsed power supply 202 delivers another high-power pulse 508. In one embodiment, the repetition rate of the high-power pulses can be between about 0.1 Hz and 10 kHz. The particular size, shape, width, and frequency of the high-power pulse depend on the process parameters, such as the operating pressure, the design of the pulsed power supply 202, the presence of a magnetic field proximate to the cathode 204, and the volume of the plasma. The shape and duration of the leading edge 506 and the trailing edge 510 of the high-power pulse 504 is chosen to control the rate of ionization of the strongly-ionized plasma.

Figure 8:
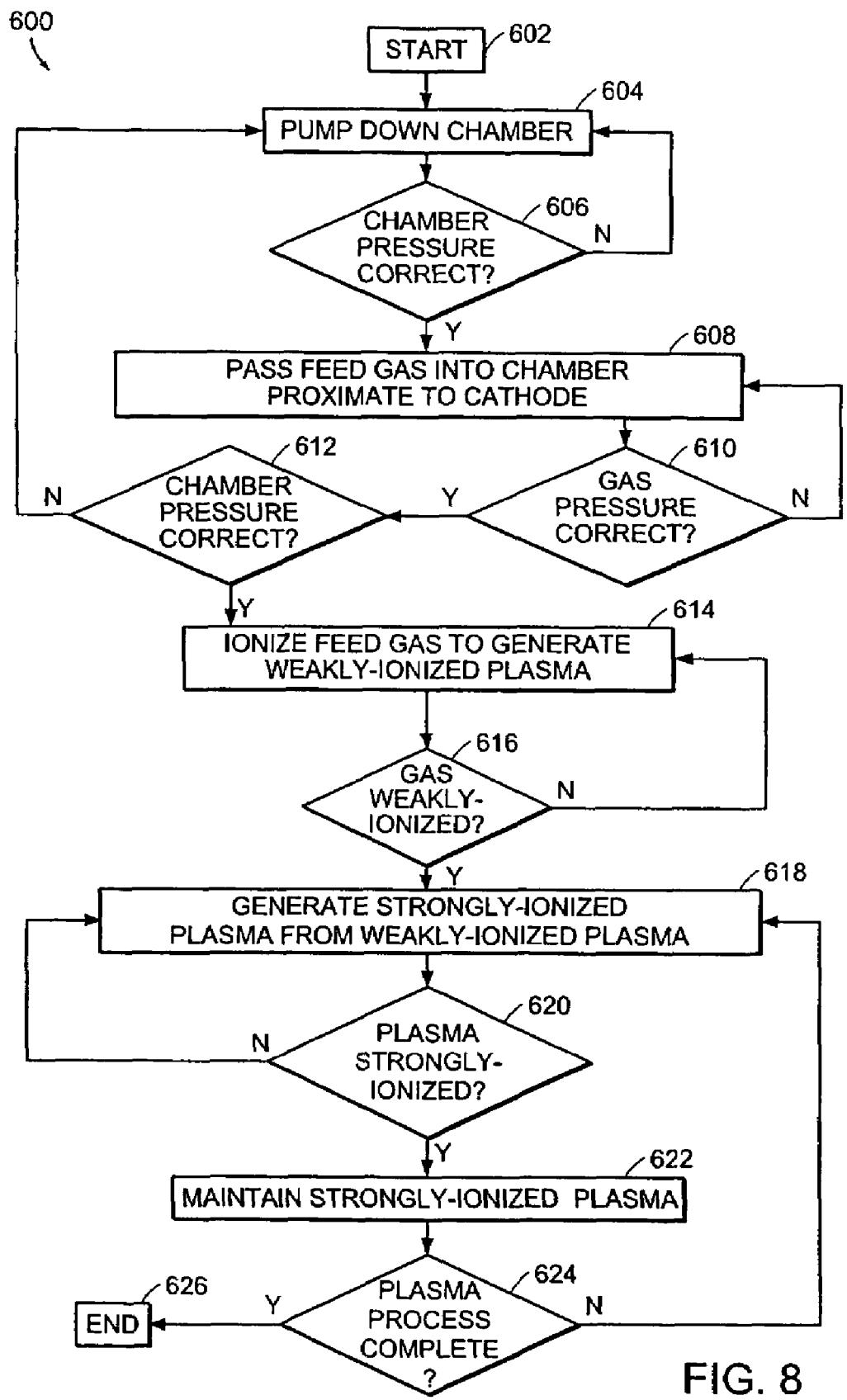
FIG. 8 is a flowchart of an illustrative method of generating a high-density plasma according to the present invention.

FIG. 8 is a flowchart 600 of an illustrative process of generating a high-density or strongly-ionized plasma according to the present invention. The process is initiated (step 602) by activating various systems in the plasma generating apparatus 200 of FIG. 2A. For example, a chamber (not shown) is initially pumped down to a specific pressure (step 604). Next, the pressure in the chamber is evaluated (step 606). In one embodiment, feed gas 226 is then pumped into the chamber (step 608). The gas pressure is evaluated (step 610). If the gas pressure is correct, the pressure in the chamber is again evaluated (step 612).

An appropriate magnetic field is generated proximate to the feed gas 226 (not shown) when the pressure in the chamber is correct. In one embodiment, a magnet assembly (not shown) can include at least one permanent magnet, and thus the magnetic field is generated constantly, even before the process is initiated. In another embodiment, a magnetic assembly (not shown) includes at least one electromagnet, and thus the magnetic field is generated only when the electromagnet is operating.

The feed gas 226 is ionized to generate a weakly-ionized plasma 232 (step 614). In one embodiment, the weakly-ionized plasma 232 can be generated by creating a relatively low current discharge in the gap 220 between the cathode 204 and the anode 216 of FIG. 2A. In another embodiment, the weakly-ionized plasma 232 can be generated by creating a relatively low current discharge between the electrode 452 and the cathode 204 of FIG. 6A. In yet another embodiment (not shown), an electrode is heated to emit electrons proximate to the cathode 204. In this embodiment, a relatively low current discharge is created between the anode 216 and the electrode in order to generate the weakly-ionized plasma 232.

In the embodiment shown in FIG. 2A, the weakly-ionized plasma 232 is generated by applying a potential across the gap 220 between the cathode 204 and the anode 216 before the introduction of the feed gas 226. In the embodiment shown in FIG. 6A, the weakly-ionized plasma 232 is generated by applying a potential difference between the electrode 452 and the cathode 204 before the introduction of the feed gas 226 to generate the weakly-ionized plasma 232.

After the gas is weakly-ionized (step 616), a strongly-ionized plasma 238 (FIG. 2D) is generated from the weakly-ionized plasma 232 (step 618). In one embodiment, the strongly-ionized plasma 238 is generated by applying a high-power pulse between the cathode 204 and the anode 216. The high-power pulse results in a strong electric field 236 being generated in the gap 220 between the anode 216 and the cathode 204 as described herein. The strong electric field 236 results in a stepwise ionization process of the feed gas 226. In one embodiment, molecular gases are used for the feed gas 226. In this embodiment, the strong electric field 236 increases the formation of ions, which enhances the strongly-ionized plasma 238. In one embodiment, the strongly-ionized plasma 238 is substantially homogeneous in the area 234 of FIG. 2D.

After the strongly-ionized plasma 238 is formed (step 620), it is maintained as required by the plasma process (step 622). Once the plasma process is completed (step 624), the plasma process is ended (step 626).

Equivalents

While the invention has been particularly shown and described with reference to specific preferred embodiments, it should be understood by those skilled in the art that various changes in form and detail may be made therein without departing from the spirit and scope of the invention as defined herein.

What is claimed is:

1. An apparatus for generating a strongly-ionized plasma, the apparatus comprising:
    a. an ionization source that generates a weakly-ionized plasma from a feed gas contained in a chamber, the weakly-ionized plasma substantially eliminating the probability of developing an electrical breakdown condition in the chamber; and
    b. a power supply that supplies power to the weakly-ionized plasma though an electrical pulse that is applied across the weakly-ionized plasma, the electrical pulse having at least one of a magnitude and a rise-time that is sufficient to transform the weakly-ionized plasma to a strongly-ionized plasma without developing an electrical breakdown condition in the chamber.

2. The apparatus of claim 1 wherein the pulsed power supply is a component in the ionization source.

3. The apparatus of claim 1 wherein the ionization source is chosen from the group comprising an electrode coupled to a DC power supply, an electrode coupled to an AC power supply, a UV source, an X-ray source, an electron beam source, an ion beam source, an inductively coupled plasma source, a capacitively coupled plasma source, and a microwave plasma source.

4. The apparatus of claim 1 wherein the power supply generates a constant power.

5. The apparatus of claim 1 wherein the power supply generates a constant voltage.

6. The apparatus of claim 1 wherein the power supply supplies power to the weakly ionized plasma at a time that is between about fifty microsecond and five second after the ionization source generates the weakly-ionized plasma.

7. The apparatus of claim 1 wherein the power supply supplies power to the weakly ionized plasma for a duration that is sufficient to generate a quasi-static electric field across the weakly-ionized plasma.

8. The apparatus of claim 1 wherein the cathode is generally formed in the shape of at least one circular disk.

9. The apparatus of claim 1 wherein the ionization source generates the weakly-ionized plasma from a reactive feed gas contained in a chamber.

10. The apparatus of claim 1 further comprising a magnet that is positioned to generate a magnetic field proximate to the weakly-ionized plasma, the magnetic field trapping electrons in the weakly-ionized plasma.

11. The apparatus of claim 10 wherein the magnet generates a magnetic field that is shaped to trap secondary electrons that are produced by ion bombardment.

12. The apparatus of claim 1 further comprising a gas line that is coupled to the chamber, the gas line supplying feed gas to the strongly-ionized plasma that transports the strongly-ionized plasma by a rapid volume exchange.

13. The apparatus of claim 12 wherein the gas volume exchange permits additional power to be absorbed by the strongly-ionized plasma.

14. A method for generating a strongly-ionized plasma, the method comprising:
  a. ionizing a feed gas in a chamber to form a weakly-ionized plasma that substantially eliminates the probability of developing an electrical breakdown condition in the chamber; and
  b. supplying an electrical pulse across the weakly-ionized plasma that excites atoms in the weakly-ionized plasma, thereby generating a strongly-ionized plasma without developing an electrical breakdown condition in the chamber.

15. The method of claim 14 wherein the ionizing the feed gas comprises exposing the feed gas to one of a static electric field, an pulsed electric field, UV radiation, X-ray radiation, electron beam radiation, and an ion beam.

16. The method of claim 14 wherein at least one of a rise time and magnitude of the electrical pulse supplied across the weakly-ionized plasma is selected to increase a density of the weakly-ionized plasma.

17. The method of claim 14 wherein at least one of a rise time and magnitude of the electrical pulse supplied across the weakly-ionized plasma is selected to excite atoms in the weakly-ionized plasma to generate secondary electrons that increase an ionization rate of the weakly-ionized plasma.

18. The method of claim 14 wherein at least one of a rise time and magnitude of the electrical pulse supplied across the weakly-ionized plasma is selected to improve uniformity of the strongly-ionized plasma.

19. The method of claim 14 further comprising supplying feed gas to the strongly-ionized plasma to transport the strongly-ionized plasma by a rapid volume exchange.

20. The method of claim 19 wherein the transport of the strongly-ionized plasma by the rapid volume exchange permits additional power to be absorbed by the strongly-ionized plasma.

21. The method of claim 14 wherein the supplying the electrical pulse comprises applying a quasi-static electric field across the weakly-ionized plasma.

22. The method of claim 14 wherein the electrical pulse comprises a rise time that is between about 0.1 microsecond and 10 seconds.

23. The method of claim 14 wherein a peak plasma density of the weakly-ionized plasma is less than about $10^{12}$ cm$^{-3}$.

24. The method of claim 14 wherein the peak plasma density of the strongly-ionized plasma is greater than about $10^{12}$ cm$^{-3}$.

25. The method of claim 14 further comprising generating a magnetic field proximate to the weakly-ionized plasma, the magnetic field trapping electrons in the weakly-ionized plasma.

26. An apparatus for generating a strongly-ionized plasma, the apparatus comprising:
  a. an anode;
  b. a cathode that is positioned adjacent to the anode;
  c. an ionization source that generates a weakly-ionized plasma proximate to the cathode, the weakly-ionized plasma substantially eliminating the probability of developing an electrical breakdown condition between the anode and the cathode; and
  d. a power supply that is electrically coupled to the anode and to the cathode, the power supply generating an electric field that excites atoms in the weakly-ionized plasma, thereby forming a strongly-ionized plasma without developing an electrical breakdown condition in the chamber.

27. The apparatus of claim 26 wherein the ionization source is chosen from the group comprising an electrode coupled to a DC power supply, an electrode coupled to an AC power supply, a UV source, an X-ray source, an electron beam source, an ion beam source, an inductively coupled plasma source, a capacitively coupled plasma source, and a microwave plasma source.

28. The apparatus of claim 26 wherein the anode and the cathode form a gap there between.

29. The apparatus of claim 28 wherein a dimension of the gap between the anode and the cathode is chosen to increase an ionization rate of the excited atoms in the weakly-ionized plasma.

30. The apparatus of claim 26 wherein at least one of a rise time and an amplitude of the electric field is chosen to increase an ionization rate of the excited atoms in the weakly-ionized plasma.

31. The apparatus of claim 26 wherein at least one of a rise time and an amplitude of the electric field is chosen to increase uniformity of the strongly-ionized plasma proximate to the cathode.

32. The apparatus of claim 26 further comprising a magnet that is positioned to generate a magnetic field proximate to the weakly-ionized plasma, the magnetic field trapping electrons in the weakly-ionized plasma proximate to the cathode.

33. An apparatus for generating a strongly-ionized plasma, the apparatus comprising:
  a. means for ionizing a feed gas in a chamber to form a weakly-ionized plasma that substantially eliminates the probability of developing an electrical breakdown condition in the chamber; and
  b. means for supplying an electrical pulse across the weakly-ionized plasma to transform the weakly-ionized plasma to a strongly-ionized plasma without developing an electrical breakdown condition in the chamber.

* * * * *

UNITED STATES PATENT AND TRADEMARK OFFICE
CERTIFICATE OF CORRECTION

| | | |
|---|---|---|
| PATENT NO. | : 7,604,716 B2 | Page 1 of 1 |
| APPLICATION NO. | : 10/897257 | |
| DATED | : October 20, 2009 | |
| INVENTOR(S) | : Chistyakov | |

It is certified that error appears in the above-identified patent and that said Letters Patent is hereby corrected as shown below:

On the Title Page please add the following information to the Patent:

Item (63)
Related U.S. Application Data
Continuation of USSN 10/065,629, filed November 4, 2002, now U.S. Patent No. 6,853,142

Signed and Sealed this

Fifth Day of January, 2010

David J. Kappos
*Director of the United States Patent and Trademark Office*